(12) United States Patent
Yang et al.

(10) Patent No.: US 10,593,727 B2
(45) Date of Patent: Mar. 17, 2020

(54) MAGNETIC MEMORY CELL INCLUDING TWO-TERMINAL SELECTOR DEVICE

(71) Applicant: Avalanche Technology, Inc., Fremont, CA (US)

(72) Inventors: Hongxin Yang, Newark, CA (US); Bing K. Yen, Cupertino, CA (US); Jing Zhang, Los Altos, CA (US)

(73) Assignee: Avalanche Technology, Inc., Fremont, CA (US)

( * ) Notice: Subject to any disclaimer, the term of this patent is extended or adjusted under 35 U.S.C. 154(b) by 168 days.

(21) Appl. No.: 15/863,825

(22) Filed: Jan. 5, 2018

(65) Prior Publication Data

US 2018/0240845 A1    Aug. 23, 2018

Related U.S. Application Data

(63) Continuation-in-part of application No. 15/438,631, filed on Feb. 21, 2017, which is a continuation-in-part of application No. 15/157,607, filed on May 18, 2016.

(51) Int. Cl.
| | |
|---|---|
| *H01L 27/22* | (2006.01) |
| *H01L 43/10* | (2006.01) |
| *H01L 43/08* | (2006.01) |
| *H01L 45/00* | (2006.01) |
| *G11C 11/16* | (2006.01) |
| *G11C 16/10* | (2006.01) |

(52) U.S. Cl.
CPC .......... *H01L 27/224* (2013.01); *G11C 11/161* (2013.01); *G11C 11/1659* (2013.01); *G11C 11/1673* (2013.01); *G11C 11/1675* (2013.01); *H01L 43/10* (2013.01); *G11C 16/10* (2013.01); *H01L 43/08* (2013.01); *H01L 45/085* (2013.01)

(58) Field of Classification Search
CPC ....... H01L 27/224; H01L 43/08; H01L 43/10; H01L 43/02; H01L 45/085; G11C 11/161; G11C 11/1659; G11C 11/1673; G11C 11/1675; G11C 16/10
USPC ....................................................... 257/421
See application file for complete search history.

(56) References Cited

U.S. PATENT DOCUMENTS

| | | | |
|---|---|---|---|
| 6,944,052 B2 * | 9/2005 | Subramanian | G11C 11/16 257/E27.004 |
| 9,767,901 B1 * | 9/2017 | Sharma | G11C 13/0069 |

(Continued)

*Primary Examiner* — Duy T Nguyen
(74) *Attorney, Agent, or Firm* — Bing K. Yen

(57) ABSTRACT

The present invention is directed to a memory cell that includes a magnetic tunnel junction (MTJ) memory element and a two-terminal selector element coupled in series. The MTJ memory element includes a magnetic free layer structure and a magnetic reference layer structure with an insulating tunnel junction layer interposed therebetween. The magnetic reference layer structure includes one or more magnetic reference layers having a first invariable magnetization direction substantially perpendicular to layer planes thereof. The two-terminal selector element includes a first inert electrode and a second inert electrode with a volatile switching layer interposed therebetween; a first active electrode formed adjacent to the first inert electrode; and a second active electrode formed adjacent to the second inert electrode. The volatile switching layer includes a plurality of metal-rich particles or clusters embedded in a matrix or at least one conductor layer interleaved with insulating layers.

15 Claims, 23 Drawing Sheets

(56) References Cited

U.S. PATENT DOCUMENTS

| | | |
|---|---|---|
| 2007/0159869 A1 | 7/2007 | Baek et al. |
| 2013/0070511 A1 | 3/2013 | Wells et al. |
| 2014/0157065 A1 | 6/2014 | Ong |
| 2014/0209892 A1 | 7/2014 | Kuo et al. |
| 2014/0264224 A1* | 9/2014 | Zhang ............... H01L 45/144 257/2 |
| 2015/0263069 A1* | 9/2015 | Jo ....................... H01L 45/085 365/148 |
| 2016/0020250 A1 | 1/2016 | Li et al. |

* cited by examiner

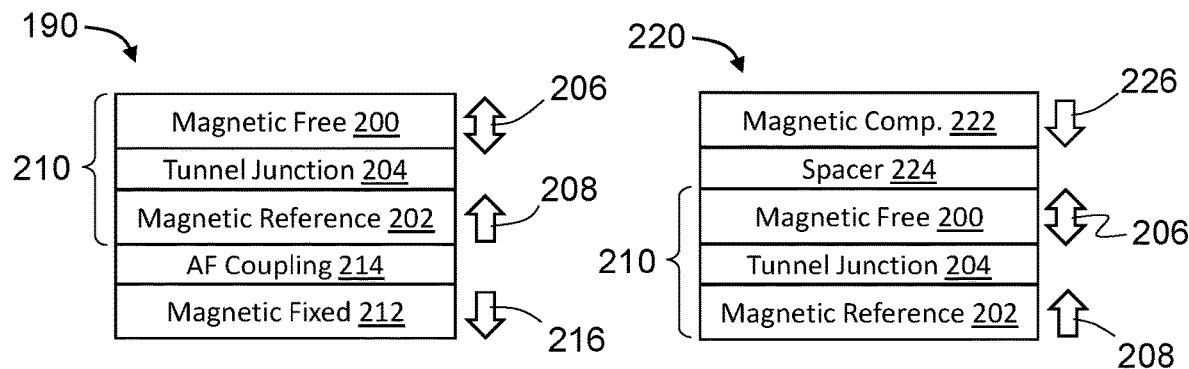
FIG. 17A
FIG. 17C
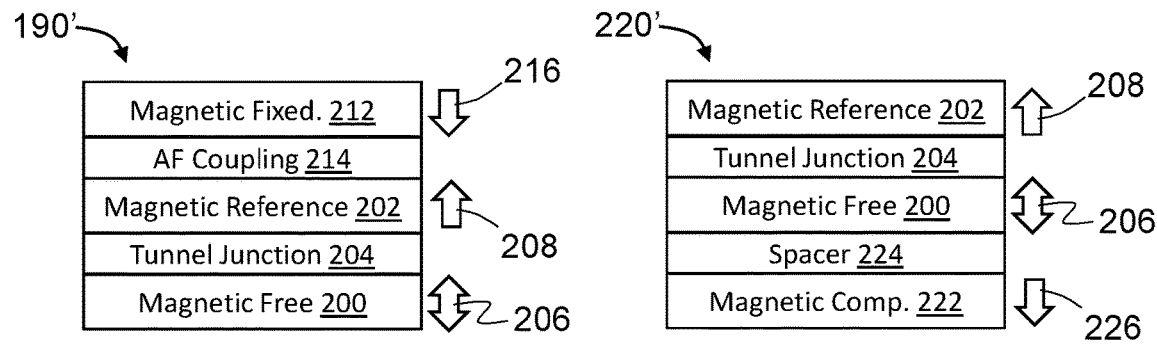
FIG. 17B
FIG. 17D

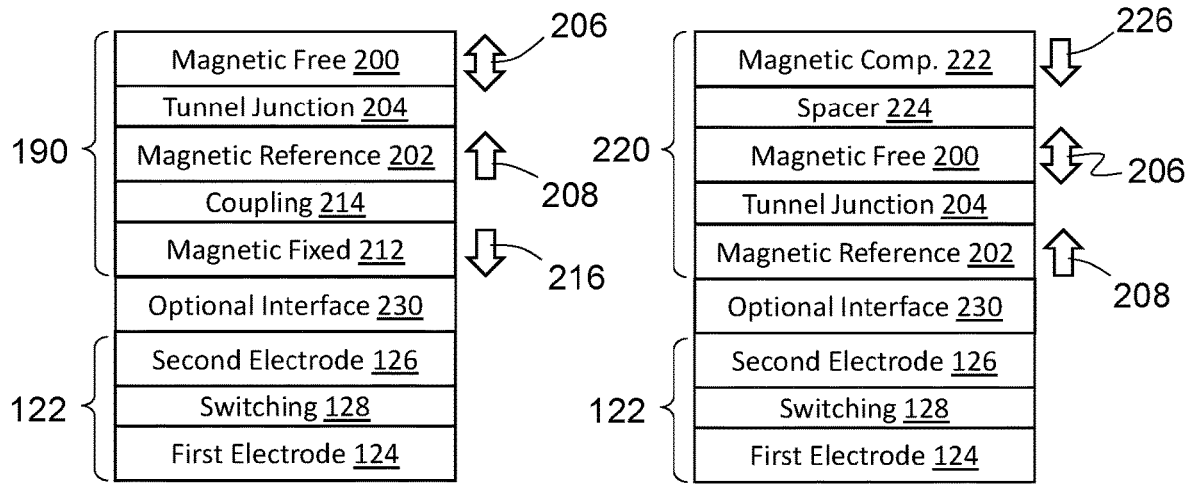
FIG. 23A
FIG. 23C
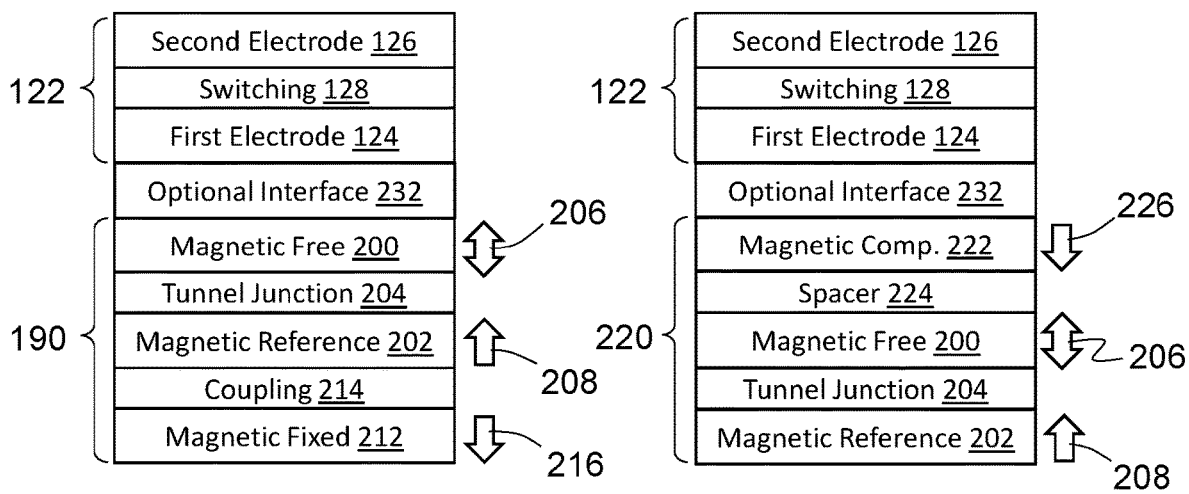
FIG. 23B
FIG. 23D

MAGNETIC MEMORY CELL INCLUDING TWO-TERMINAL SELECTOR DEVICE

CROSS-REFERENCE TO RELATED APPLICATIONS

The present application is a continuation-in-part of the commonly assigned application bearing Ser. No. 15/438,631 filed on Feb. 21, 2017 by Yang et al., entitled "Selector Device Having Asymmetric Conductance for Memory Applications," and a continuation-in-part of the commonly assigned application bearing Ser. No. 15/157,607 filed on May 18, 2016 by Yang et al., entitled "Selector Device Incorporating Conductive Clusters for Memory Applications." The contents of all of these applications, including their specifications, are incorporated herein by reference in their entirety.

BACKGROUND

The present invention relates to a memory cell for data storage applications, and more particularly, to embodiments of a memory cell including a magnetic tunnel junction (MTJ) memory element coupled to a two-terminal selector device in series.

Spin transfer torque magnetic random access memory (STT-MRAM) is a new class of non-volatile memory, which can retain the stored information when powered off. A conventional STT-MRAM device normally comprises an array of memory cells, each of which includes a magnetic memory element and a selection transistor coupled in series between appropriate electrodes. The selection transistor functions like a switch to direct current or voltage through the selected magnetic memory element coupled thereto. Upon application of a switching current through the magnetic memory element, the electrical resistance of the magnetic memory element would change accordingly, thereby switching the stored logic in the respective memory cell.

FIG. 1 is a schematic circuit diagram of a conventional magnetic memory array 20, which comprises a plurality of memory cells 22 with each of the memory cells 22 including a selection transistor 24 coupled to a magnetic memory element 26; a plurality of parallel word lines 27 with each being coupled to the gates of a respective row of the selection transistors 24 in a first direction; a plurality of parallel bit lines 28 with each being coupled to a respective row of the magnetic memory elements 26 in a second direction substantially perpendicular to the first direction; and a plurality of parallel source lines 29 with each being coupled to a respective row of the selection transistors 24 in the second direction.

The use of the two-terminal selector instead of transistor would allow the memory cell to attain the minimum cell size of 4 $F^2$, where F denotes the minimum feature size or one half the minimum pitch normally associated with a particular manufacturing process, thereby increasing memory array density. However, conventional bidirectional two-terminal selector devices, such as Ovonic threshold switch (OTS), have relatively low on/off ratio and are prone to current leakage compared with conventional selection transistors.

For the foregoing reasons, there is a need for a bidirectional two-terminal selector device for memory applications that has high on/off switching speed and low current leakage and that can be inexpensively manufactured.

SUMMARY

The present invention is directed to a two-terminal selector that satisfies this need. A magnetic memory cell having features of the present invention comprises a magnetic tunnel junction (MTJ) memory element coupled to a bidirectional two-terminal selector element in series. The MTJ memory element includes a magnetic free layer structure and a magnetic reference layer structure with an insulating tunnel junction layer interposed therebetween. The magnetic free layer structure includes one or more magnetic free layers having a variable magnetization direction substantially perpendicular to layer planes thereof. The magnetic reference layer structure includes one or more magnetic reference layers having a first invariable magnetization direction substantially perpendicular to layer planes thereof. The two-terminal selector element includes a first electrode structure and a second electrode structure with a volatile switching layer structure interposed therebetween. The volatile switching layer structure includes a plurality of metal-rich particles or clusters embedded in an insulating matrix or at least one conductive layer interleaved with insulating layers. The first and second electrode structures each may include one or more electrode layers.

According to an aspect of the present invention, the volatile switching layer structure of the selector element is in contiguous contact with a first and a second inert electrode layers. The selector element further includes a first active electrode layer formed adjacent to the first inert electrode layer opposite the volatile switching layer structure and a second active electrode layer formed adjacent to the second inert electrode layer opposite the volatile switching layer structure.

BRIEF DESCRIPTION OF THE DRAWINGS

These and other features, aspects, and advantages of the present invention will become better understood with regard to the following description, appended claims, and accompanying drawings where:

FIGS. 17A-17D are cross sectional views of exemplary structures for a magnetic tunnel junction (MTJ) memory element in accordance with an embodiment of the present invention;

FIGS. 23A-23D are cross sectional views of exemplary magnetic memory cell structures formed by integrating the selector element of FIG. 10 and variants of the MTJ memory element illustrated in FIGS. 17A-17D.

For purposes of clarity and brevity, like elements and components will bear the same designations and numbering throughout the Figures, which are not necessarily drawn to scale.

DETAILED DESCRIPTION

In the following description, directional terms, such as "front," "back," "top," "bottom," and the like, may be used with reference to the orientation of the illustrated figure. Spatially relative terms, such as "beneath," "below," "under," "lower," "upper," "above," etc., may be used herein to describe one element's relationship to another element(s) as illustrated in the figure. Since articles and elements can be positioned in a number of different orientations, these terms are intended for illustration purposes and in no way limit the invention.

Where reference is made herein to a material AB composed of element A and element B, the material AB can be an alloy, a compound, or a combination thereof, with the atomic concentration of A or B ranges from 0.1 to 99.9%, except where the context excludes that possibility. Similarly, a material ABC composed of elements A, B, and C may be an alloy, a compound, or a combination thereof, with the atomic concentration of each element in the range of 0.1 to 99.8%, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 nm and whose upper limit is 100 nm.

Figure 1:
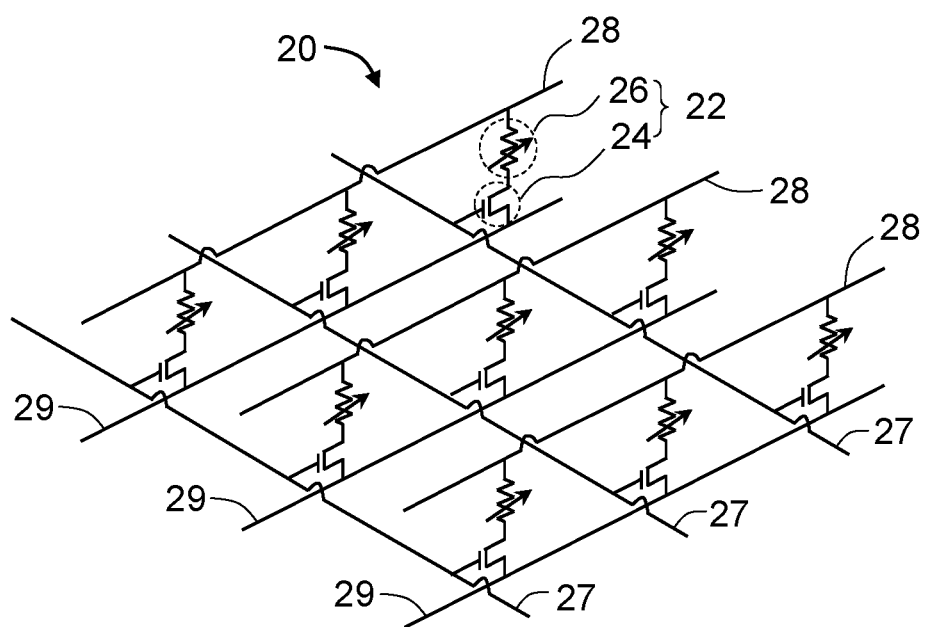
FIG. 1 is a schematic circuit diagram for a conventional memory array that includes a plurality of magnetic memory cells with each cell including a magnetic memory element and a selection transistor coupled in series.
Figure 2A:
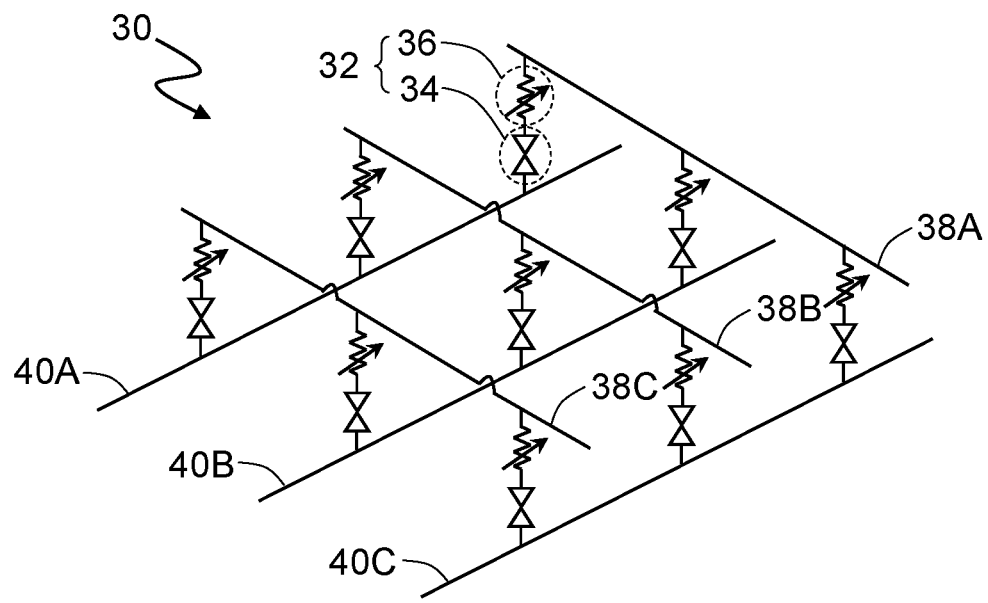
FIGS. 2A and 2B are schematic circuit diagrams showing embodiments of a memory array that includes a plurality of memory cells with each cell including a magnetic memory element and a two-terminal selector element coupled in series.

FIG. 2A is a schematic circuit diagram of a memory array 30, which comprises a plurality of memory cells 32 with each of the memory cells 32 including a two-terminal selector element 34 coupled to a magnetic memory element 36 in series; a first plurality of parallel conductive lines 38A-C with each being coupled to a respective row of the magnetic memory elements 36 in a first direction; and a second plurality of parallel conductive lines 40A-C with each being coupled to a respective row of the selector elements 34 in a second direction substantially perpendicular to the first direction. Accordingly, the memory cells 32 are located at the cross points between the first and second plurality of conductive lines 38A-C and 40A-C. The first and second plurality of conductive lines 38A-C and 40A-C may be word lines and bit lines, respectively, or vice versa. The stacking order of the two-terminal selector elements 34 and the magnetic memory elements 36 may be inverted between the first and second plurality of conductive lines 38A-C and 40A-C to form the memory cells 32' shown in FIG. 2B. Multiple layers of the memory array 30 or 30' may be stacked on a wafer substrate to form a monolithic three-dimensional memory device. Alternatively, alternating layers of the memory array 30 and the memory array 30' may be stacked on a wafer substrate to form the three-dimensional memory device.

Figure 3A:
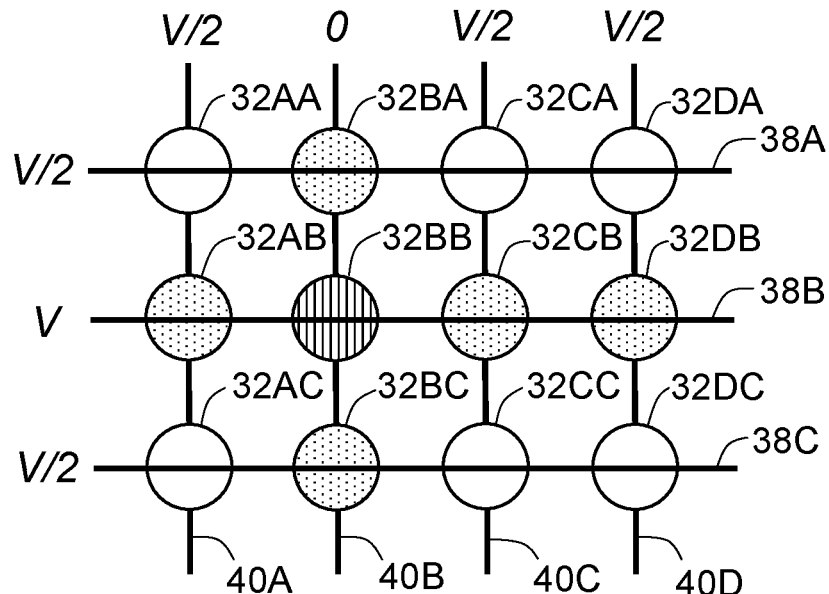
FIGS. 3A and 3B illustrate different schemes for selecting a memory cell for sensing or programming.
Figure 3A:
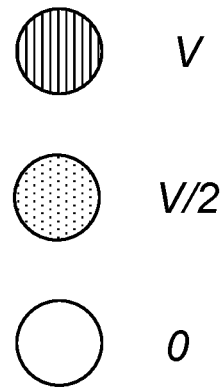

FIG. 3A illustrates a scheme for selecting a memory cell in the memory array 30 or 30' for sensing or programming by turning on the selector element of the selected cell. The memory cell 32BB is selected by applying a voltage, V, to one of the first conductive lines 38B coupled thereto, while grounding one of the second conductive lines 40B connected to the selected memory cell 32BB, thereby generating a net potential difference of V across the memory cell 32BB. Meanwhile, to minimize current leakage and prevent accidental programming of the unselected memory cells, a voltage of about V/2 is applied to the unselected second conductive lines 40A, 40C-D and the unselected first conductive lines 38A, 38C, resulting in a net potential difference of V/2 across the unselected memory cells 32BA, 32AB, 32CB, 32DB, 32BC that are coupled to either the selected first conductive line 38B or the selected second conductive line 40B. The cell voltage of V is greater than $V_{th}$ to ensure that the selector element of the selected memory cell 32BB becomes conductive, while the cell voltage of V/2 is not high enough for the selector elements of the unselected memory cells 32BA, 32BC, 32AB, 32CB, and 32DB to become conductive. The rest of the unselected memory cells 32AA, 32CA, 32DA, 32AC, 32CC, and 32DC that are not connected to the selected first conductive line 38B or the selected second conductive line 40B experience essentially no potential drop thereacross.

Figure 3B:
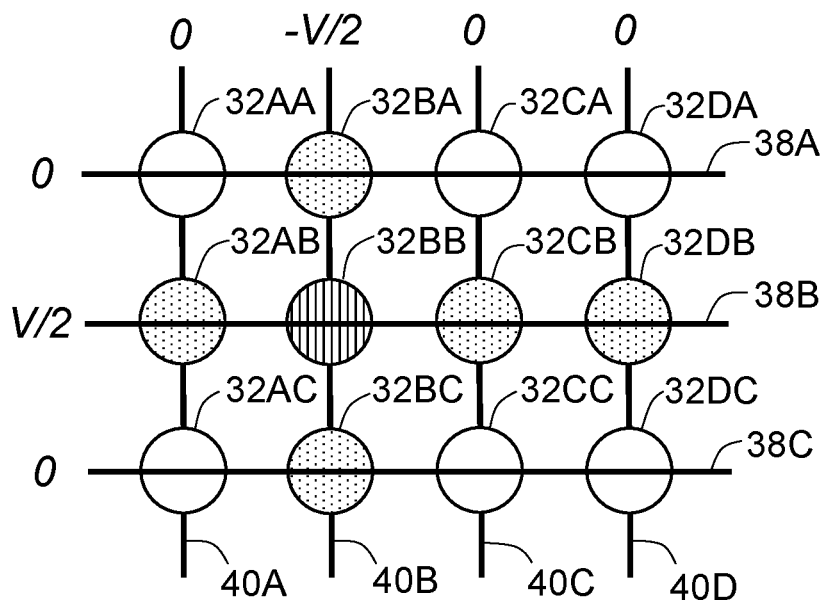
Figure 3B:
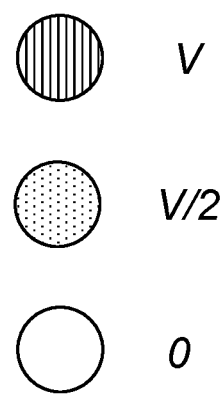

FIG. 3B illustrates an alternative scheme for selecting the memory cell 32BB for sensing or programming. The memory cell 32BB is selected by applying a first voltage, +V/2, to the first conductive line 38B coupled thereto and a second voltage, −V/2, to the second conductive line 40B coupled thereto, thereby generating a potential difference of V across the memory cell 32BB. Meanwhile, the unselected second conductive lines 40A, 40C-D and the unselected first conductive lines 38A, 38C are grounded. The application of +V/2 to the selected first conductive line 38B results in a net potential difference of V/2 across the unselected memory cells 32AB, 32CB, 32DB coupled thereto. Similarly, application of −V/2 to the selected second conductive line 40B results in a net potential difference of V/2 across the unselected memory cells 32BA, 32BC coupled thereto. The potential difference of V is greater than $V_{th}$ to ensure that the selector element of the memory cell 32BB becomes conductive, while the potential difference of V/2 is not high enough for the selector elements of the unselected memory cells 32BA, 32BC, 32AB, 32CB, and 32DB to become conductive. The rest of the unselected memory cells 32AA, 32CA, 32DA, 32AC, 32CC, and 32DC that are not connected to the selected first conductive line 38B or the selected second conductive line 40B experience essentially no potential drop thereacross.

Referring back to FIGS. 2A and 2B, the magnetic memory element 36 normally includes a magnetic reference layer and a magnetic free layer with an electron tunnel junction layer interposed therebetween. The magnetic reference layer, the electron tunnel junction layer, and the magnetic free layer collectively form a magnetic tunnel junction (MTJ). Upon the application of an appropriate current through the MTJ, the magnetization direction of the magnetic free layer can be switched between two directions: parallel (same) and anti-parallel (opposite) with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel orientations with respect to the magnetization direction of the reference layer. Therefore, the MTJ has two stable resistance states that allow the MTJ to serve as a non-volatile memory element.

Based on the relative orientation between the magnetic reference and free layers and the magnetization directions thereof, an MTJ can be classified into one of two types: in-plane MTJ, the magnetization directions of which lie substantially within planes parallel to the same layers, or perpendicular MTJ, the magnetization directions of which are substantially perpendicular to the layer planes.

Figure 4A:
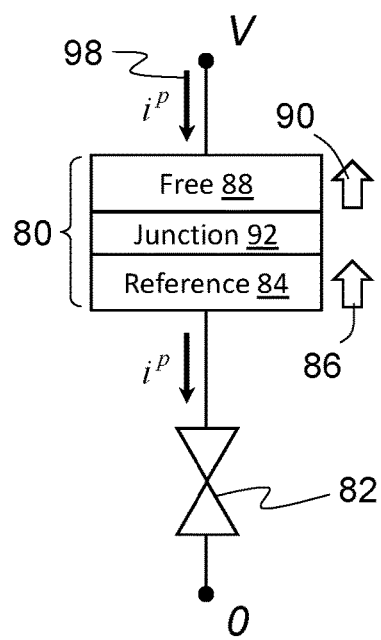
FIGS. 4A and 4B illustrate schemes for programming a magnetic memory cell to low and high resistance states, respectively.
Figure 4B:
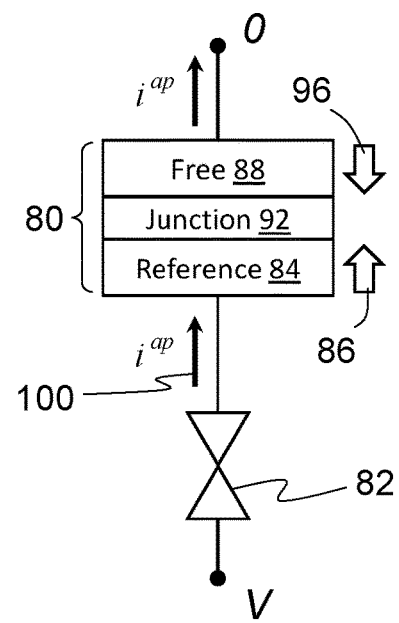

FIGS. 4A and 4B illustrate the programming operations for an STT-MRAM cell including a perpendicular MTJ memory element 80 coupled to a two-terminal selector element 82 in series. The MTJ memory element 80 includes a magnetic reference layer 84 having an invariable or fixed magnetization direction 86 perpendicular to the layer plane thereof, a magnetic free layer 88 having a variable magnetization direction 90 or 96 perpendicular to the layer plane thereof, and a tunnel junction layer 92 interposed therebetween.

FIG. 4A illustrates the writing or programming process for switching the resistance state of the MTJ memory element 80 from high to low. As electrons that pass through the magnetic reference layer 84 are being spin-polarized, the spin-polarized electrons exert a spin transfer torque on the magnetic free layer 88. When the spin-polarized current or parallelizing current ($i^P$) 98 exceeds a threshold level, the magnetic free layer 88 switches from the anti-parallel to parallel magnetization direction 90 with respect to the fixed magnetization direction 86 of the magnetic reference layer 84. It should be noted that the parallelizing write current ($i^P$) 98 flows in the opposite direction as the electrons.

Conversely, FIG. 4B illustrates the writing process for switching the resistance state of the MTJ memory element 80 from low to high. As electrons pass through the magnetic free layer 88, the electrons with the same spin direction as that of the magnetization in the magnetic reference layer 84 pass into the magnetic reference layer 84 unimpeded. However, the electrons with the opposite spin direction are reflected back to the magnetic free layer 88 at the boundary between the tunnel junction layer 92 and the magnetic reference layer 84, causing the magnetization direction 96 of the magnetic free layer 88 to switch from the parallel to anti-parallel orientation when the anti-parallelizing current ($i^{aP}$) 100 exceeds a threshold level.

Figure 5A:
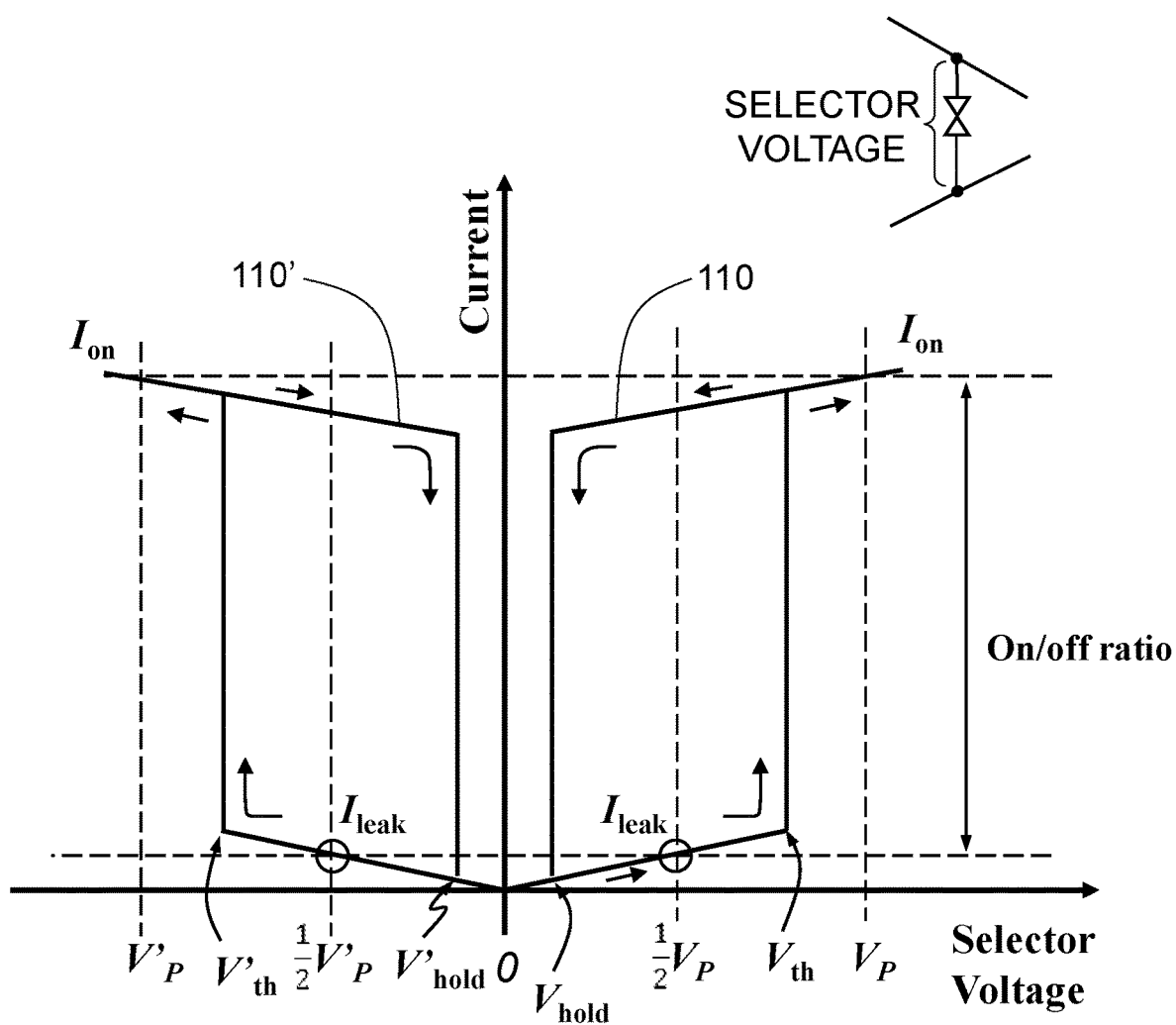
FIGS. 5A and 5B are exemplary I-V response plots for a bidirectional selector element having symmetric conductance.

FIG. 5A shows an exemplary current-voltage (I-V) response plot for a bidirectional two-terminal selector element in accordance with an embodiment of the present invention. The I-V response curve 110 shows the magnitude of electric current passing through the two-terminal selector element as the voltage applied thereto varies. Initially, the current slightly increases with the applied voltage from zero to near a threshold voltage, $V_{th}$. At or near $V_{th}$, the current rapidly increases and exhibits a highly non-linear exponential behavior, indicating a transition of the selector element from a nominally insulative or "off" state to a nominally conductive or "on" state. As the selector voltage continues to increase beyond $V_{th}$, the current increase becomes gradual until reaching $V_P$, which may be the programming voltage required to drive a switching current through a magnetic memory element coupled to the selector element. The current response behaves like a step function as the applied voltage increases from zero to $V_P$ with the sharp increase occurring at or near $V_{th}$, which may be about 60-80% of $V_P$. As previously shown in FIGS. 3A and 3B, during the programming operation, the unselected memory cells coupled to either the selected word line or the selected bit line are subjected to a net applied voltage equivalent to about half the programming voltage. Therefore, the leakage current, $I_{leak}$, for the selector element in the "off" state is measured at the selector voltage of $V_P/2$. The ratio of $I_{on}$, which is the selector current at $V_P$, to $I_{leak}$ measured at $V_P/2$ is sometimes referred to as "on/off ratio."

With continuing reference to FIG. 5A, as the selector voltage decreases from $V_P$ to near a holding voltage, $V_{hold}$, which is lower than $V_{th}$, the selector current gradually decreases and the selector element remains in the highly conductive state. At or near $V_{hold}$, the current rapidly decreases and exhibits a highly non-linear behavior, indicating a transition from the nominally conductive state back to the nominally insulative state. As the voltage continues to decrease beyond $V_{hold}$, the current flow slightly decreases until stopping at about 0 V. Therefore, the selector element requires the continuing application of a voltage to be conductive and is therefore a volatile device.

The I-V response curve 110 of the selector behaves like a hysteresis loop. The nominally insulating selector element turns on or becomes conductive when the selector voltage exceeds $V_{th}$. Once in the conductive state, the selector element will stay on or remain conductive until the selector voltage dropping below $V_{hold}$, which is less than $V_{th}$. In a conventional write or programming operation, the selector element may be first turned on by raising the selector voltage to about $V_{th}$. The selector voltage may then be further increased to a higher level $V_P$ that is sufficient to drive a current $I_{on}$ for switching the resistance state of the magnetic memory element. In a conventional read or sensing operation, the selector element may be first turned on by raising the selector voltage to about $V_{th}$. The selector voltage is then decreased to a level between $V_{th}$ and $V_{hold}$ to minimize "read disturbance" while ensuring that the selector element is sufficiently conductive to allow a sensing current to pass therethrough for determining the resistance state of the magnetic memory element.

The two-terminal selector element characterized by the I-V response plot of FIG. 5A is bidirectional as the polarity of the selector voltage may be reversed from zero to $V'_P$ as shown. The I-V response curve 110' corresponding to the opposite polarity may be substantially similar to the curve 110 described above. The two response curves 110 and 110' for the selector element are therefore substantially "symmetric" with respect to the current (vertical) axis at Selector Voltage=0.

Figure 5B:
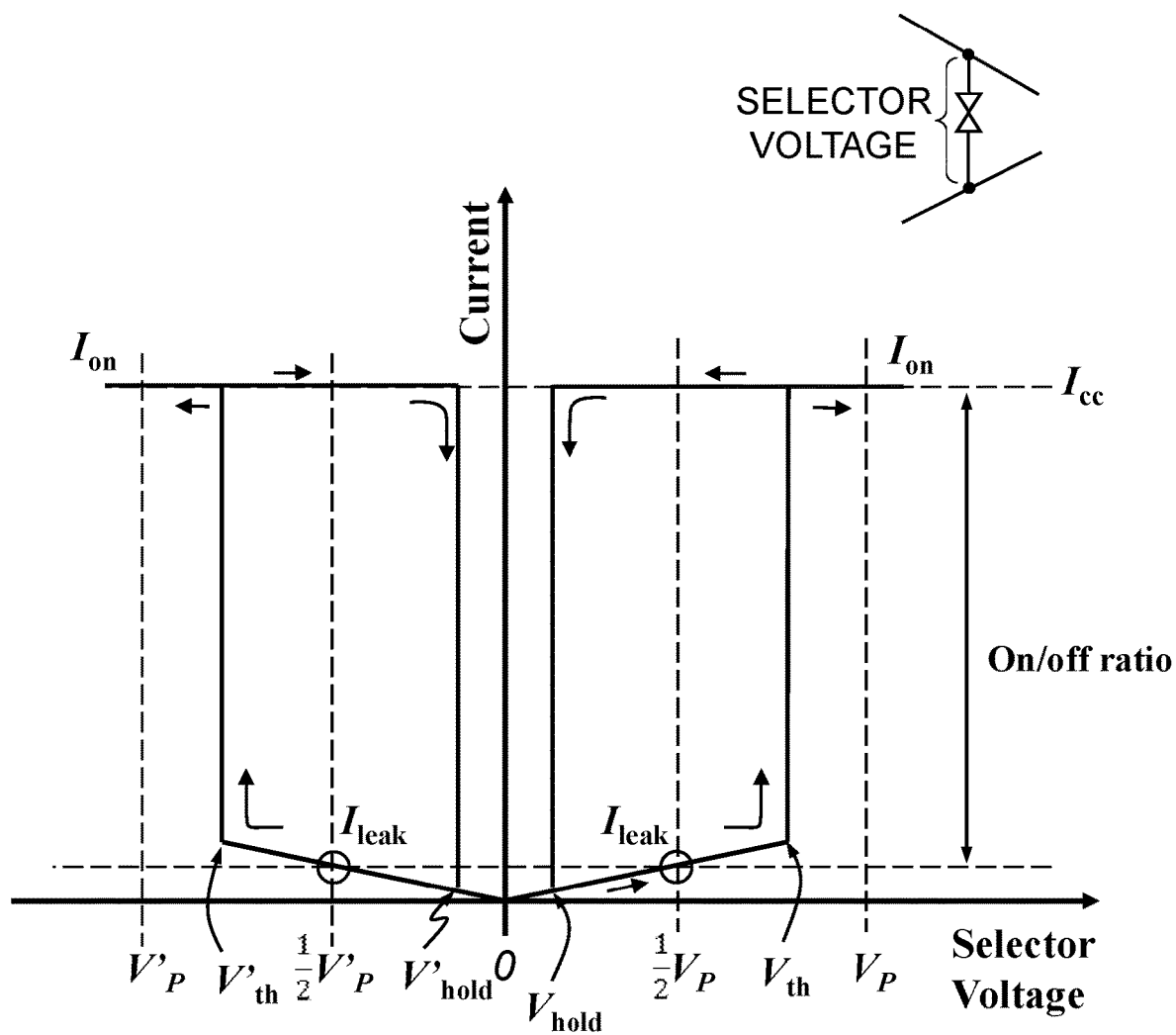

A bidirectional selector element may alternatively have an I-V response shown in FIG. 5B. The I-V response plot of FIG. 5B differs from the I-V response plot of FIG. 5A in that after the selector element is turned on at $V_{th}$, the current remains substantially constant with continuously increasing selector voltage or decreasing selector voltage until reaching $V_{hold}$, below which the selector element is turned off. The constant current is sometimes referred to as "compliance current" ($I_{cc}$).

Figure 6A:
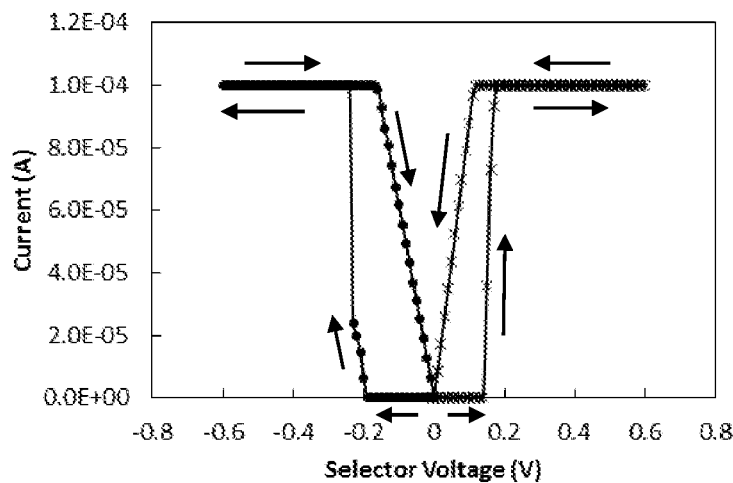
FIGS. 6A-6C are I-V response plots for a selector element, an MTJ memory element, and a memory cell comprising the selector element and the MTJ memory element coupled in series, respectively.
Figure 6A:
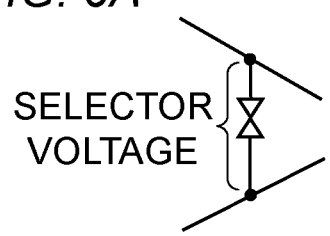
Figure 6B:
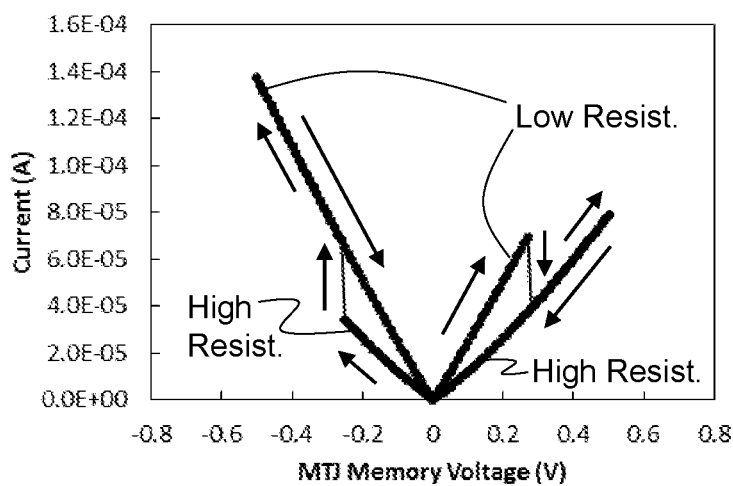
Figure 6B:
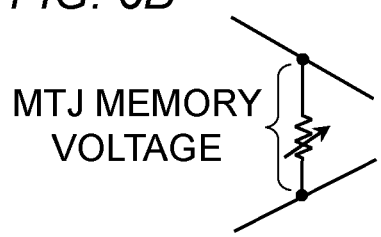
Figure 6C:
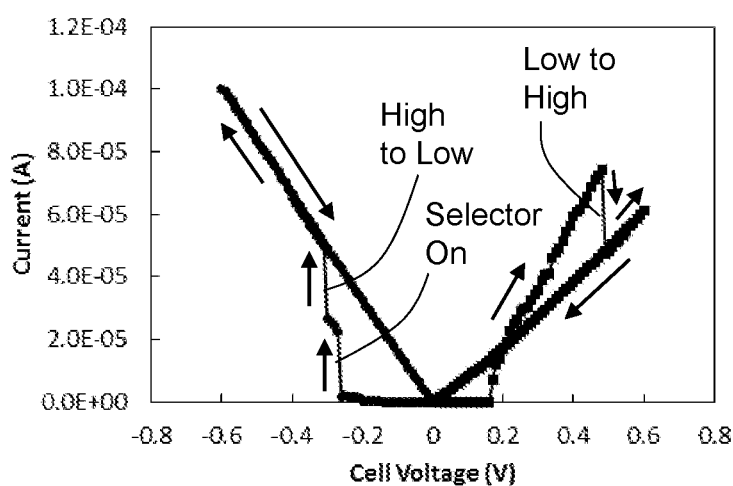
Figure 6C:
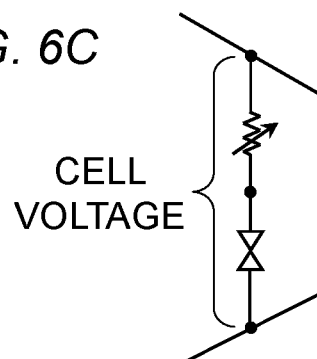

FIGS. 6A-6C show I-V response plots for a two-terminal selector element, an MTJ memory element, and a memory cell comprising the two-terminal selector element and the MTJ memory element coupled in series, respectively. The I-V response plot of FIG. 6A shows the magnitude of electric current passing through the two-terminal selector element as the voltage applied thereto varies between +0.6 and -0.6 V. As the applied voltage increases from 0 to 0.6 V, the selector element turns on or becomes substantially conductive at about 0.17 V (threshold voltage), which is characterized by the rapid increase in the current passing through the selector element. At the selector voltage of about 0.2 V, the selector current reaches a maximum value of about 100 µA (compliance current) and remains at essentially the same level until 0.6 V. As the selector voltage decreases from 0.6 to 0 V, the selector current remains at about 100 µA until about 0.1 V (holding voltage), below which the selector current rapidly drops off to indicate the selector element becoming nominally insulative again. As the polarity of the applied voltage to the selector element is reversed (i.e. between 0 and -0.6 V), the current flow is reversed and reaches a maximum value of about 100 µA (compliance current) at about -0.2 V and beyond. The selector current stays at the maximum level as the selector voltage varies from -0.6 to about -0.1 V (holding voltage), beyond which the selector current rapidly drops off. The I-V response curve of the selector element in the negative voltage region is analogous to that in the positive voltage region with the two curves being substantially symmetric with respect to a vertical axis at Selector Voltage=0 (not shown).

FIG. 6B shows the magnitude of electric current passing through the MTJ memory element as the voltage applied thereto varies between +0.5 and -0.5 V. As the applied voltage to the MTJ memory element increases from 0 to 0.5 V, the current passing through the MTJ memory element continually increases but with an abrupt drop at about 0.28 V (switching voltage), indicating the transition from low to high resistance state. Further increase in the voltage does not change the resistance state. As the polarity of the voltage applied to the MTJ memory element is reversed (i.e. 0 to -0.5 V), the current through the MTJ memory element continually increases and experiences an abrupt jump at about -0.25 V (switching voltage), indicating the transition from high to low resistance state. Therefore, the I-V response plot of FIG. 6B shows the MTJ memory element having relatively symmetric switching voltages.

Figure 2B:
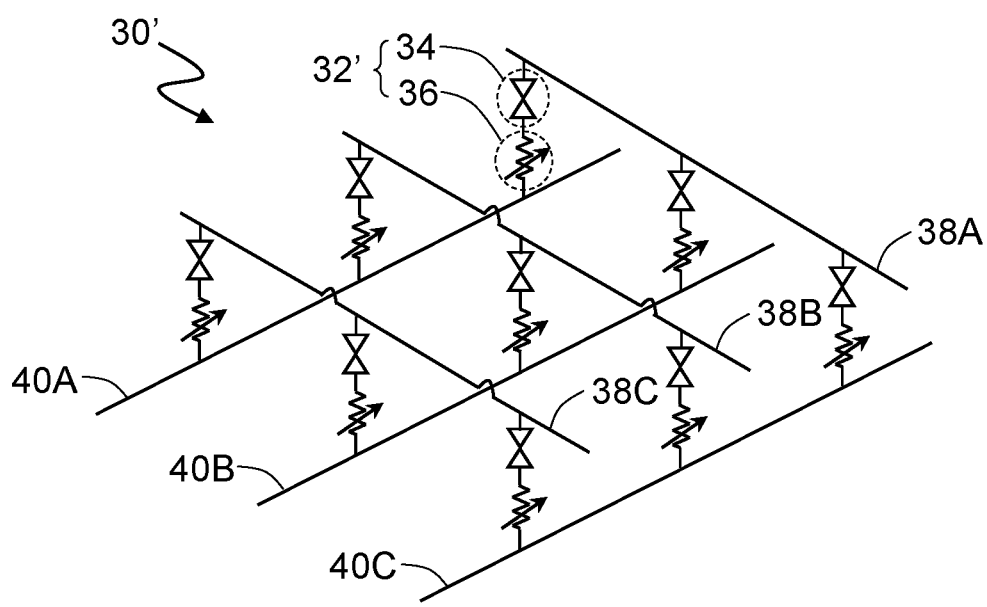

FIG. 6C shows the magnitude of electric current passing through the memory cell as the voltage applied thereto varies between +0.6 and -0.6 V. The memory cell includes the selector element having the I-V response shown in FIG. 6A and the MTJ memory element having the I-V response shown in FIG. 6B coupled in series. Since the voltage is applied to the memory cell at two ends thereof via two conductive lines as shown in FIGS. 2A and 2B, only the memory cell voltage is controlled, not the individual selector voltage or MTJ voltage. While the selector element and the MTJ memory element individually show relatively symmetric on/off or switching behavior, the memory cell formed by the selector element and the MTJ memory element coupled in series may exhibit asymmetric switching behavior. For example, FIG. 6C shows the MTJ memory element having switching voltages of about 0.49 (low to high resistance) and 0.32 V (high to low resistance), a difference of 0.17 V, when coupled to the selector element. The asymmetric switching behavior of the MTJ memory element in the memory cell may be due to the difference in the net or effective voltage that the MTJ memory element experiences when the same element is in different resistance states. When a voltage is applied to the memory cell, the net or effective voltage on the MTJ memory element will be lower when the MTJ memory element is in the low resistance state compared with the high resistance state. Therefore, a higher memory cell voltage (~0.49 V) may be required to switch the MTJ memory element from the low to high resistance state.

Since the capacity of the power supply for a memory circuit is mostly dictated by the programming voltage or current used in the programming operation, it may be desirable to balance the switching voltages of the memory cell to reduce the power supply voltage and to minimize power consumption. Moreover, the balancing of the switching voltages may prevent unintended high to low resistance switching when the selector element is turn on for a sense or read operation because the close proximity between the selector turn-on voltage and the MTJ switching voltage as shown in FIG. 6C.

The switching voltages of a memory cell made of an MTJ memory element and a selector element coupled in series may be balanced by modifying the switching behavior of the MTJ memory element to be asymmetric and/or modifying the I-V response of the selector element to be asymmetric.

Figure 7:
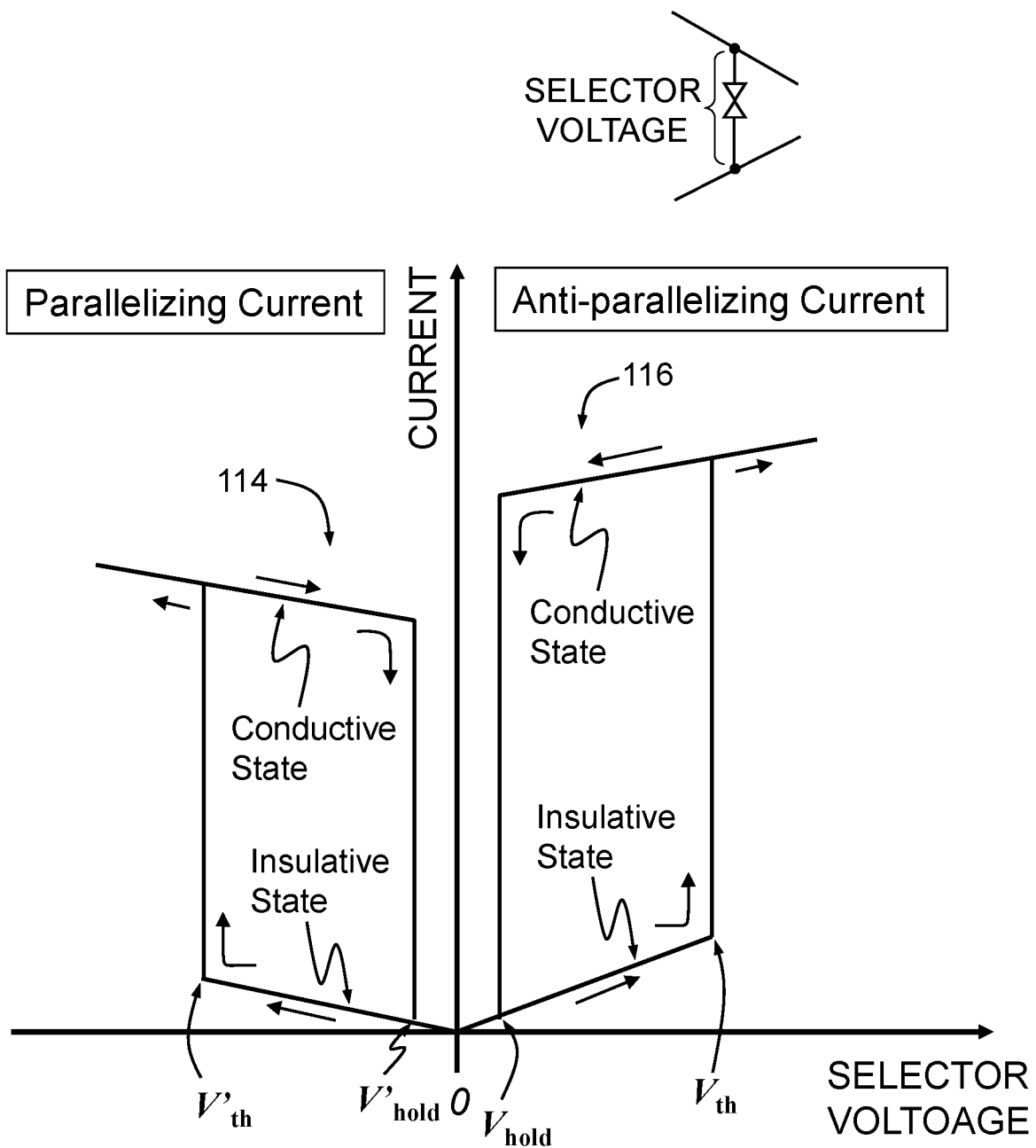
FIG. 7 is an exemplary I-V response plot for a bidirectional selector element having asymmetric conductance.

Accordingly, an embodiment of the present invention as applied to a memory cell includes an MTJ memory element coupled to a selector element with asymmetric I-V response. FIG. 7 shown an exemplary I-V response plot for the asymmetric selector element without a load coupled thereto. In an embodiment, the two I-V response curves 114 and 116 correspond to the directions of parallelizing (high to low MTJ resistance) and anti-parallelizing (low to high MTJ resistance) currents, respectively. As explained above and illustrated in FIGS. 4A and 4B, the parallelizing current ($i^p$) flows in the direction from the free layer to the reference layer, while the anti-parallelizing current ($i^{ap}$) flows in the opposite direction. The I-V response curves 114 and 116 of FIG. 7 show the selector element in the conductive state having a higher selector current in the direction of anti-parallelizing current than in the direction of parallelizing current at the same absolute selector voltage. Therefore, the selector element in the conductive ("on") state has a higher conductance or lower resistance in the direction of anti-parallelizing current than in the direction of parallelizing current.

With continuing reference to the I-V response plot of FIG. 7, the threshold voltages (absolute values) $V_{th}$ and $V'_{th}$ of the asymmetric selector element in the anti-parallelizing and parallelizing current directions, respectively, may be different or substantially the same. In an embodiment, $V_{th}$ is greater than $V'_{th}$. In an alternative embodiment, $V'_{th}$ is greater than $V_{th}$. Similarly, the holding voltages (absolute values) $V_{hold}$ and $V'_{hold}$ in the anti-parallelizing and parallelizing current directions, respectively, may be different or substantially the same. In an embodiment, $V_{hold}$ is greater than $V'_{hold}$. In an alternative embodiment, $V'_{hold}$ is greater than $V_{hold}$. The I-V slopes in the nominally insulative ("off") state along the anti-parallelizing and parallelizing current directions, respectively, may be different or substantially the same. In an embodiment, the I-V slope in the nominally insulative state along the anti-parallelizing current direction is greater than that along the parallelizing current direction. In an alternative embodiment, the I-V slope in the nominally insulative state along the parallelizing current direction is greater than that along the anti-parallelizing current direction. Analogously, the I-V slopes in the conductive ("on") state along the anti-parallelizing and parallelizing current directions, respectively, may be different or substantially the same. In an embodiment, the I-V slope in the conductive state along the anti-parallelizing current direction is greater than that along the parallelizing current direction. In an alternative embodiment, the I-V slope in the conductive state along the parallelizing current direction is greater than that along the anti-parallelizing current direction.

In alternative embodiments, the two I-V response curves 114 and 116 correspond to the directions of anti-parallelizing (low to high MTJ resistance) and parallelizing (high to low MTJ resistance) currents, respectively.

Figure 8:
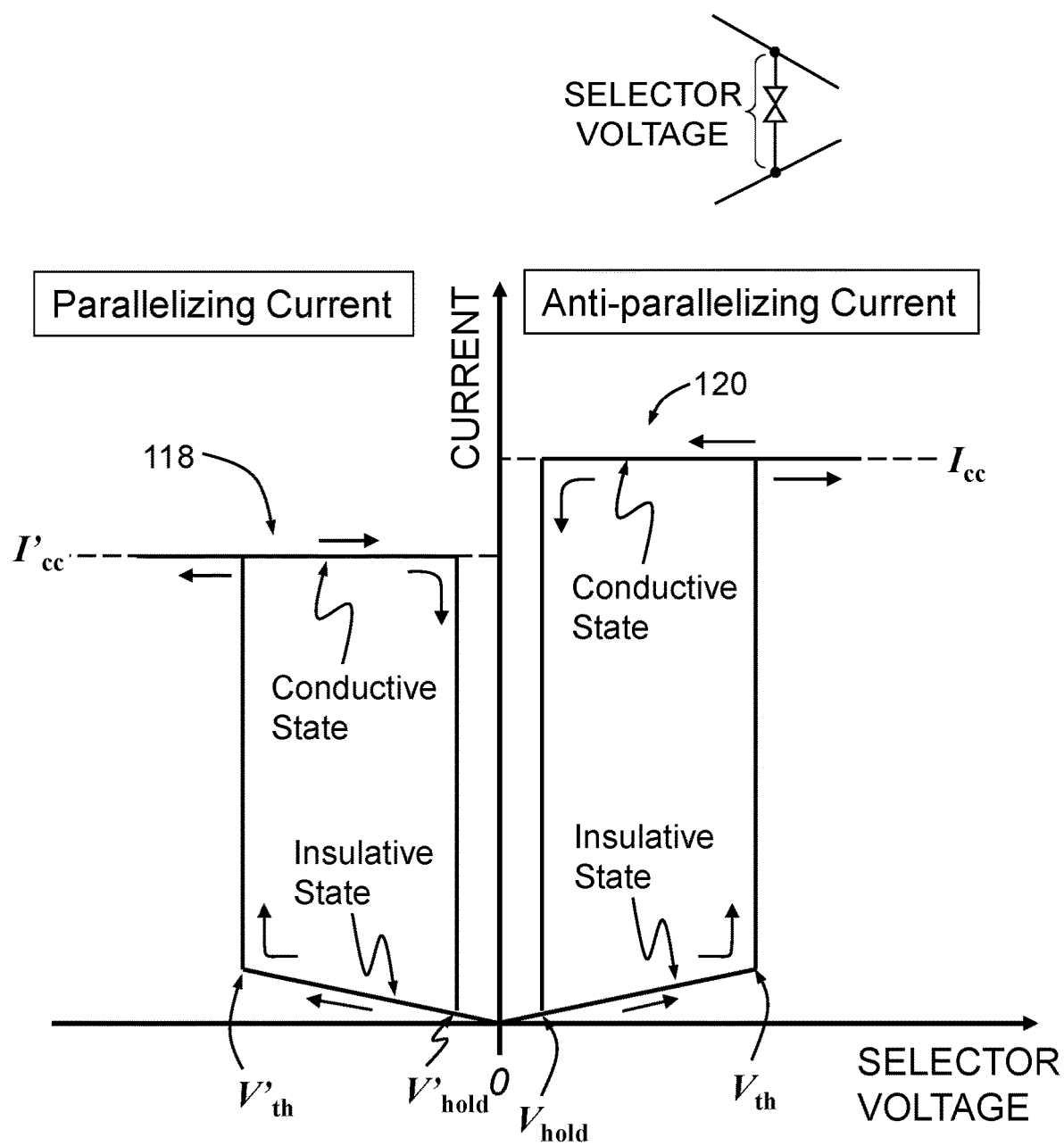
FIG. 8 is another exemplary I-V response plot for a bidirectional selector element having asymmetric conductance.

The selector element with asymmetric I-V response may alternatively exhibit the exemplary I-V response curves 118 and 120 shown in FIG. 8. The I-V response plot of FIG. 8 is analogous to the plot of FIG. 7 except that the selector currents $I_{cc}$ and $I'_{cc}$ in the conductive state along the anti-parallelizing and parallelizing current directions, respectively, remain relatively constant with selector voltage. The selector current ($I_{cc}$) in the conductive state along the direction of the anti-parallelizing current is higher than the selector current ($I'_{cc}$) along the direction of parallelizing current. Therefore, the selector element in the conductive ("on") state has a higher conductance or lower resistance in the direction of anti-parallelizing current than in the direction of parallelizing current.

In alternative embodiments, the two I-V response curves 118 and 120 correspond to the directions of anti-parallelizing (low to high MTJ resistance) and parallelizing (high to low MTJ resistance) currents, respectively.

Figure 9A:
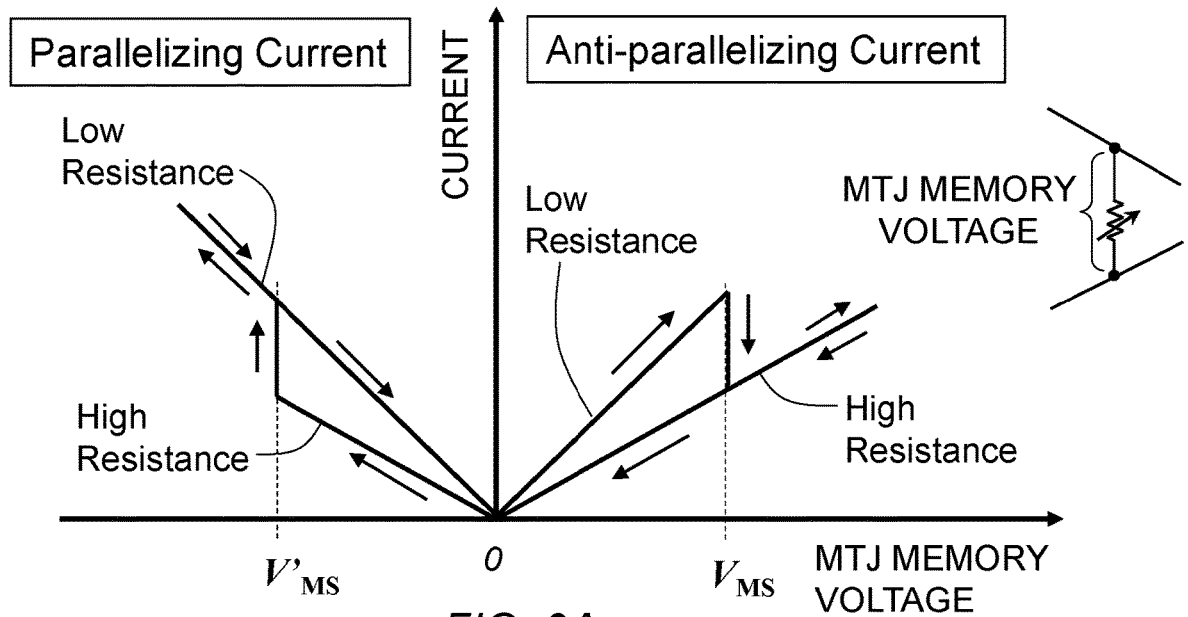
FIG. 9A is an I-V response plot for an MTJ memory element having symmetric switching voltages.
Figure 9B:
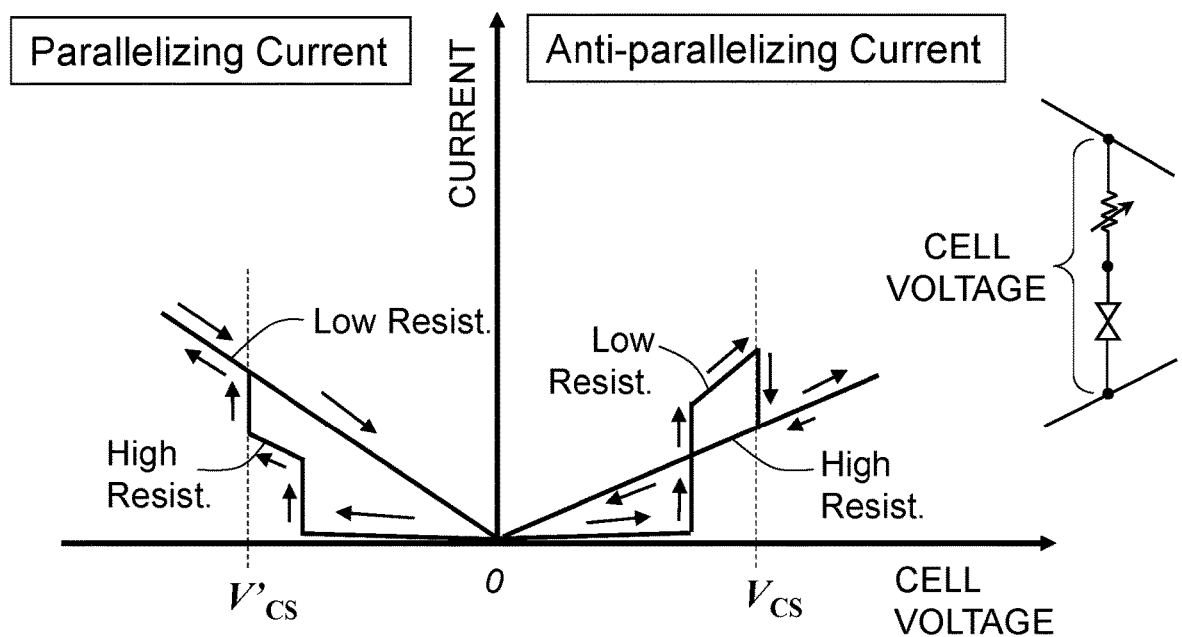
FIG. 9B is an I-V response plot for a memory cell having symmetric switching voltages.

In an embodiment of the present invention, the applied voltages to the memory cell, which includes the selector element exhibiting the asymmetric I-V response characteristics shown and described with reference to FIG. 7 or FIG. 8, for switching the resistance of the MTJ memory element from the low to high state ($V_{CS}$) and from the high to low state ($V'_{CS}$), respectively, are substantially the same as shown in FIG. 9B. In another embodiment, the switching voltages of the MTJ memory element from the low to high state ($V_{MS}$) and from the high to low state ($V'_{MS}$), respectively, are substantially the same as shown in FIG. 9B. In another embodiment, the memory cell with substantially symmetric cell switching voltages ($V_{CS}$ and $V'_{CS}$) as shown in FIG. 9B includes the MTJ memory element exhibiting substantially symmetric memory switching voltages ($V_{MS}$ and $F_{MS}$) as shown in FIG. 9A coupled to the selector element exhibiting the asymmetric I-V response as shown and described with reference to FIG. 7 or FIG. 8.

Figure 10:
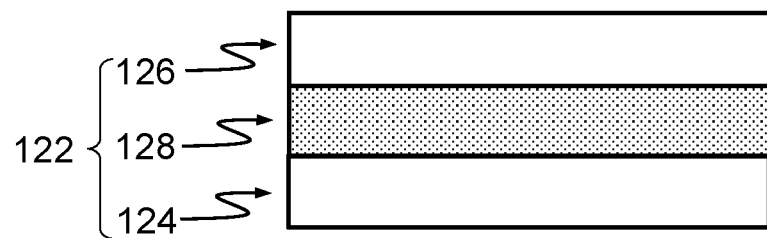
FIG. 10 is a cross sectional view of a selector element structure in accordance with an embodiment of the present invention.

An embodiment of the present invention as applied to a two-terminal selector element 122 will now be described with reference to FIG. 10. Referring now to FIG. 10, the illustrated selector element 122 includes a first electrode structure 124 and a second electrode structure 126 with a volatile switching layer structure 128 interposed therebetween.

Figure 11A:
FIGS. 11A-11C are cross sectional views of three exemplary structures for the volatile switching layer structure in the selector element of FIG. 10.

The volatile switching layer structure 128, which may include one or more distinct volatile switching layers, behaves like a volatile device that is nominally insulative in the absence of an applied voltage or current. Upon continuing application of a switching voltage or current, however, the volatile switching layer structure 128 becomes conductive. In an embodiment illustrated in FIG. 11A, the volatile switching layer structure 128 includes a homogeneous layer 128a made of a nominally insulating material or any suitable material that switches its resistance in the presence of an applied field or current, such as but not limited to $SiO_x$, $SiN_x$, $AlO_x$, $MgO_x$, $TaO_x$, $VO_x$, $NbO_x$, $TiO_x$, $WO_x$, $HfO_x$, $ZrO_x$, $NiO_x$, $FeO_x$, $YO_x$, $EuO_x$, $SrO_x$, $AsO_x$, $SbO_x$, $SnO_x$, $InO_x$, $SeO_x$, $GaO_x$, $CeO_x$, $TeO_x$, $CuGe_xS_y$, $CuAg_xGe_yS_z$, $GeSb_xTe_y$, $AgIn_xSb_yTe_z$, $GeTe_x$, $SbTe_x$, $GeSb_x$, $CrO_x$, $SrTi_xO_y$, $YZr_xO_y$, $LaF_x$, $AgI_x$, $CuI_x$, $RbAg_xI_y$, or any combination thereof. The exemplary compounds may be stoichiometric or non-stoichiometric. The homogeneous layer 128a may further include one or more dopant or alloying elements, such as but not limited to Ag, Au, Zn, Sn, Ni, As, and Cu.

Figure 11B:
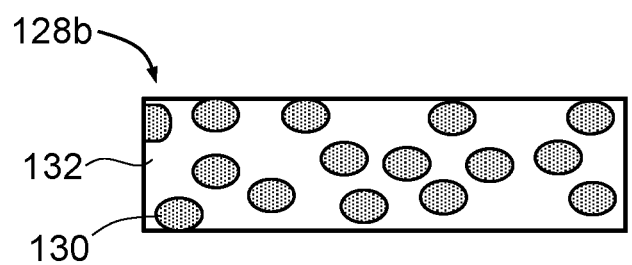

Alternatively, the volatile switching layer structure 128 may include a composite layer 128b comprising a plurality of metal-rich particles or clusters 130 embedded in a nominally insulating matrix 132 as illustrated in FIG. 11B. The nominally insulating matrix 132 may be made of any suitable material, such as but not limited to $SiO_x$, $SiN_x$, $AlO_x$, $MgO_x$, $TaO_x$, $VO_x$, $NbO_x$, $TiO_x$, $WO_x$, $HfO_x$, $ZrO_x$, $NiO_x$, $FeO_x$, $YO_x$, $EuO_x$, $SrO_x$, $AsO_x$, $SbO_x$, $SnO_x$, $InO_x$, $SeO_x$, $GaO_x$, $CeO_x$, $TeO_x$, $CuGe_xS_y$, $CuAg_xGe_yS_z$, $GeSb_x$-

Te$_y$, AgIn$_x$Sb$_y$Te$_z$, GeTe$_x$, SbTe$_x$, GeSb$_x$, CrO$_x$, SrTi$_x$O$_y$, YZr$_x$O$_y$, LaF$_x$, AgI$_x$, CuI$_x$, RbAg$_x$I$_y$, or any combination thereof. The exemplary compounds may be stoichiometric or non-stoichiometric.

With continuing reference to FIG. 11B, the plurality of metal-rich particles or clusters 130 may be made of a relatively inert metal, or an alloy including one or more inert metals, or a fast electric field enhanced diffuser material, or any combination thereof. Examples of the inert metal include gold (Au), silver (Ag), platinum (Pt), palladium (Pd), rhodium (Rh), iridium (Ir), ruthenium (Ru), osmium (Os), rhenium (Re), and any combinations thereof. Examples of the fast electric field enhanced diffuser material include nickel (Ni), copper (Cu), silver (Ag), gold (Au), zinc (Zn), cobalt (Co), iron (Fe), tungsten (W), molybdenum (Mo), tantalum (Ta), niobium (Nb), aluminum (Al), titanium (Ti), zirconium (Zr), arsenic (As), titanium nitride (TiN$_x$), zirconium nitride (ZrN$_x$), tantalum nitride (TaN$_x$), niobium nitride (NbN$_x$), tungsten nitride (WN$_x$), and any combinations thereof. The exemplary nitrides may be stoichiometric or non-stoichiometric. In an embodiment, the concentration of the plurality of metal-rich particles or clusters 130 in the matrix 132 decreases along the direction of the anti-parallelizing current.

The composite layer structure 128b shown in FIG. 11B may be fabricated by co-sputtering, whereby the target for the plurality of metal-rich particles or clusters 130 and the target for the insulating matrix 132 are sputtered at the same time. Alternatively, the composite layer structure 128b may be fabricated by alternating sputter deposition of materials corresponding to the metal-rich particles or clusters 130 and the insulating matrix 132. The sputter-deposited film by both methods may subsequently subjected to an annealing process to enhance the diffusion or precipitation of the metal-rich particles or clusters 130.

Figure 11C:
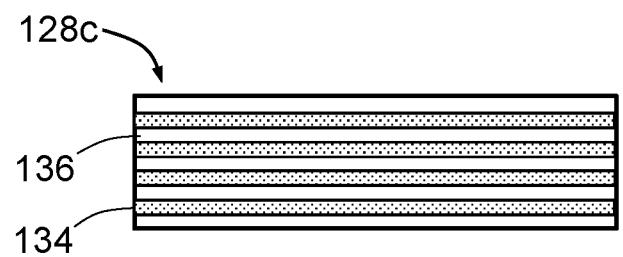

Still alternatively, the volatile switching layer structure 128 may have a multilayer structure 128c comprising one or more conductive layers 134 interleaved with two or more insulating layers 136 as illustrated in FIG. 11C. The conductive layers 134 may be made of any of the suitable conductive materials described above for the metal-rich particles or clusters 130. The thickness of the conductive layers 134 may range from several angstroms to several nanometers. In some cases where the conductive layers 134 are extremely thin, one or more of the conductive layers 134 may be punctured by holes, thereby rendering the layer coverage to be discontinuous in some regions. Similarly, the nominally insulating layers 136 may be made of any of the suitable insulating materials described above for the matrix 132. In an embodiment, the thicknesses of the conductive layers 134 decrease and/or the thicknesses of the insulating layers 136 increase along the direction of the anti-parallelizing current.

Figure 12A:
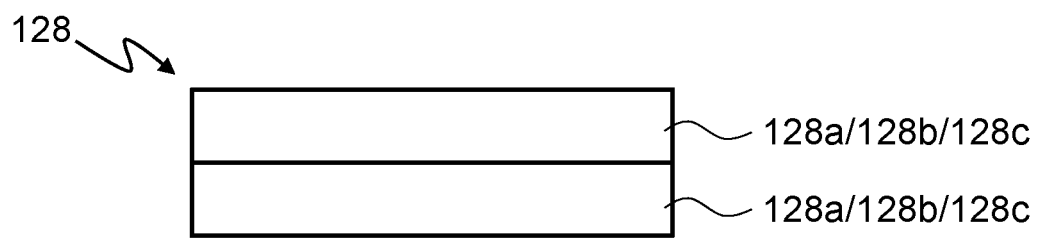
FIGS. 12A-12C are cross sectional views of exemplary structures for a volatile switching layer structure having two, three, and four switching layers, respectively.
Figure 12B:
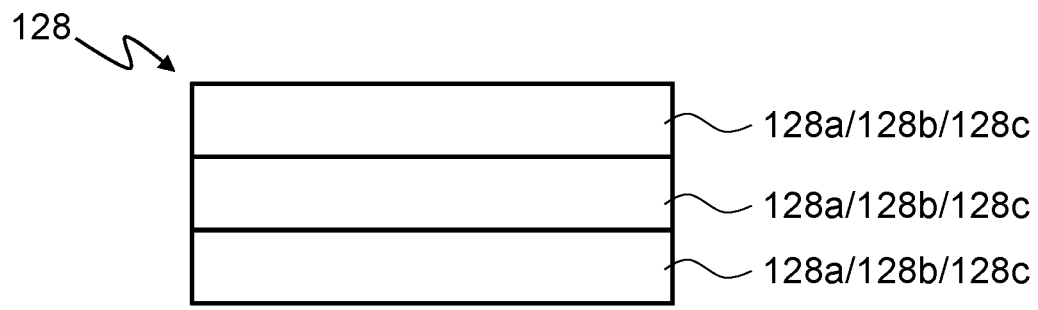
Figure 12C:
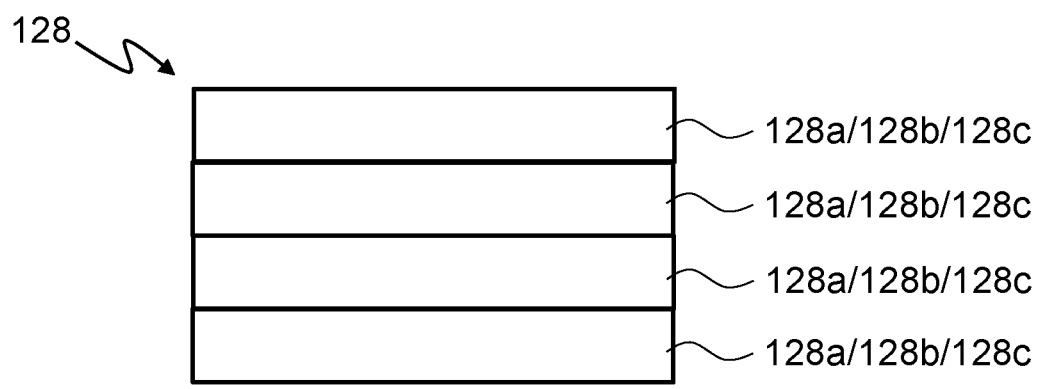

The volatile switching layer structure 128 may alternatively include two or more volatile switching layers with each switching layer being a homogenous layer 128a, a composite layer 128b, or a multilayer structure 128c. FIGS. 12A-12C illustrate the volatile switching layers structure 128 including two, three, and four switching layers, respectively.

Figure 13A:
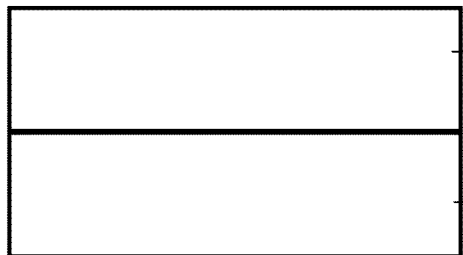
FIGS. 13A-13F are cross sectional views of exemplary structures for a volatile switching layer structure having two switching layers.
Figure 13D:
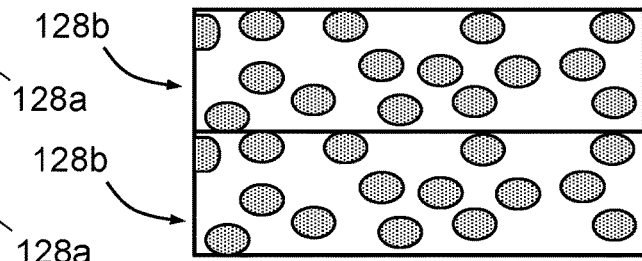
Figure 13B:
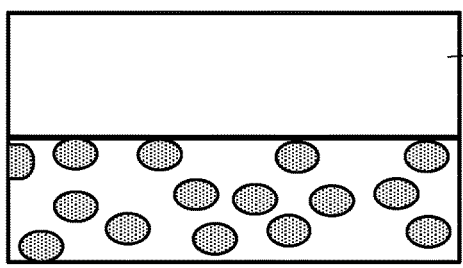
Figure 13E:
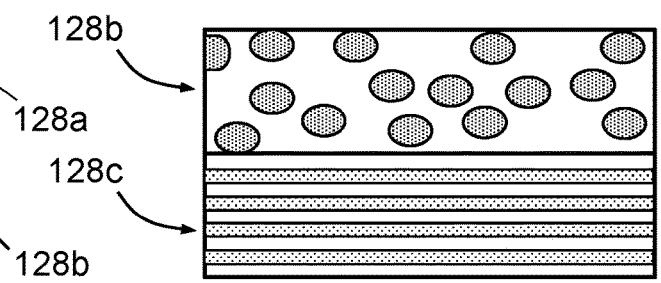
Figure 13C:
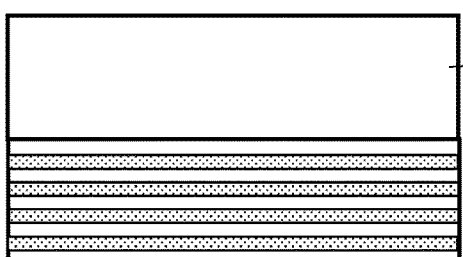
Figure 13F:
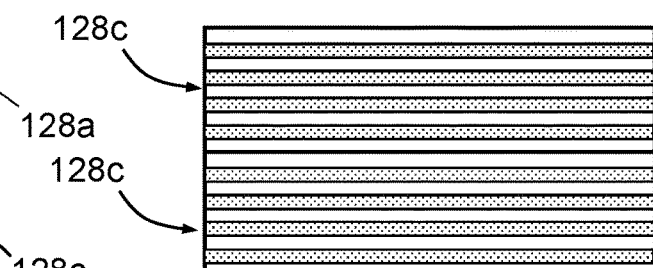

Some examples of the volatile switching layer structure 128 having two switching layers are illustrated in FIGS. 13A-13F. FIG. 13A shows an exemplary structure having two homogenous layers 128a, which may be made of different materials and/or having different dopants if present. FIG. 13B shows another exemplary structure including a homogenous layer 128a and a composite layer 128b. In an embodiment, the homogenous layer 128a and the matrix 132 of the composite layer 128b are made of the same material. In an alternative embodiment, the homogenous layer 128a and the matrix 132 of the composite layer 128b are made of different materials. FIG. 13C shows still another exemplary structure including a homogenous layer 128a and a multilayer structure 128c. In an embodiment, the homogenous layer 128a and the insulating layers 136 of the multilayer structure 128c are made of the same material. In an alternative embodiment, the homogenous layer 128a and the insulating layers 136 of the multilayer structure 128c are made of different materials. FIG. 13D shows yet another exemplary structure including two composite layer 128b, which may have different materials for the matrix 132 and/or different materials for the metal-rich particles or clusters 130. FIG. 13E shows still yet another exemplary structure including a composite layer 128b and a multilayer structure 128c. The matrix 132 of the composite layers 128b and the insulating layers 136 of the multilayer structure 128c may be made of the same material or different materials. Likewise, the metal-rich particles or clusters 130 of the composite layer 128b and the conductive layers 134 of the multilayer structure 128c may be made of the same material or different materials. FIG. 13F shows yet still another exemplary structure including two multilayer structures 128c, which may have different materials for the insulating layers 136 and/or different materials for the conductive layers 134. Moreover, the stacking order of the volatile switching layers in the exemplary structures illustrated in FIGS. 13A-13F may be inverted.

Figure 14A:
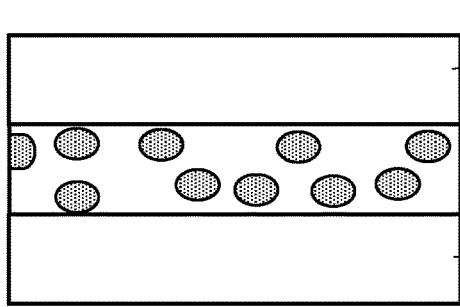
FIGS. 14A-14F are cross sectional views of exemplary structures for a volatile switching layer structure having three switching layers.

Some examples of the volatile switching layer structure 128 having three switching layers are illustrated in FIGS. 14A-14F. FIG. 14A shows an exemplary structure including two homogenous layers 128a with a composite layer 128b interposed therebetween. The two homogenous layers 128a may be made of the same material or different materials. The matrix 132 of the composite layer 128b and at least one of the two homogeneous layers 128a may be made of the same material. Alternatively, the matrix 132 of the composite layer 128b may be made of a different material from the two homogeneous layers 128a.

Figure 14D:
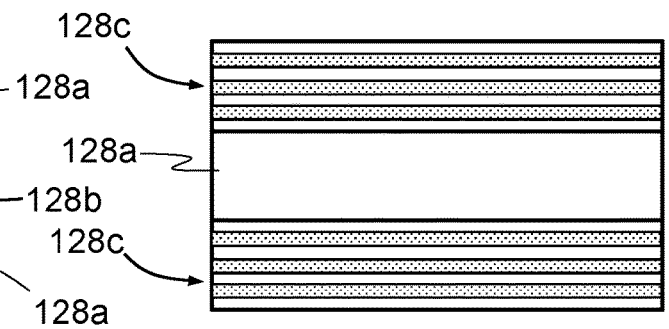
Figure 14B:
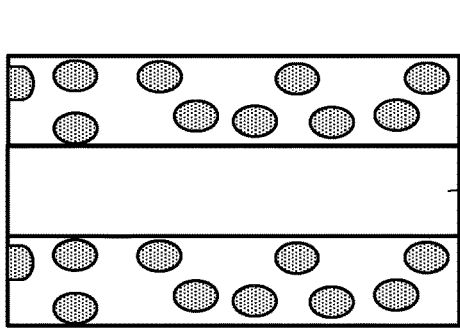

FIG. 14B shows another exemplary structure including two composite layers 128b with a homogeneous layer 128a interposed therebetween. The matrices 132 of the two composite layers 128b may be made of the same material or different materials. The metal-rich particles or clusters 130 of the two composite layers 128b may be made of the same material or different materials. The homogeneous layer 128a and at least one of the two matrices 132 of the two composite layers 128b may be made of the same material. Alternatively, the homogeneous layer 128a may be made of a different material from the two matrices 132 of the two composite layers 128b.

Figure 14E:
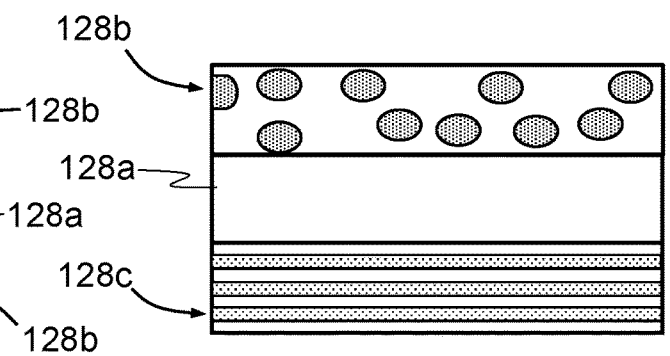
Figure 14C:
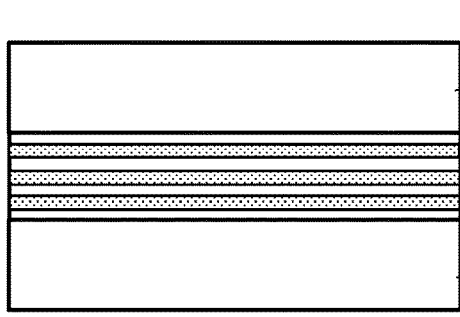

FIG. 14C illustrates still another exemplary structure including two homogenous layers 128a with a multilayer structure 128c interposed therebetween. The two homogenous layers 128a may be made of the same material or different materials. The insulating layers 136 of the multilayer structure 128c and at least one of the two homogeneous layers 128a may be made of the same material. Alternatively, the insulating layers 136 of the multilayer structure 128c may be made of a different material from the two homogeneous layers 128a.

FIG. 14D illustrates yet another exemplary structure including two multilayer structures 128c with a homogeneous layer 128a interposed therebetween. The insulating layers 136 of the two multilayer structures 128c may be made of the same material or different materials. Likewise, the conductive layers 134 of the two multilayer structures 128c may be made of the same material or different materials. The homogeneous layer 128a and at least one of the two stacks of insulating layers 136 of the two multilayer structures 128c may be made of the same material. Alternatively, the homogeneous layer 128a may be made of a different material from the insulating layers 136 of the two multilayer structures 128c.

FIG. 14E shows still yet another exemplary structure including a composite layer 128b and a multilayer structure 128c with a homogeneous layer 128a interposed therebetween. The matrix 132 of the composite layer 128b and the insulating layers 136 of the multilayer structure 128c may be made of the same material or different materials. The metal-rich particles or clusters 130 of the composite layer 128b and the conductive layers 134 of the multilayer structure 128c may be made of the same material or different materials. The homogeneous layer 128a and at least one of the matrix 132 of the composite layer 128b and the insulating layers 136 of the multilayer structure 128c may be made of the same material. Alternatively, the homogeneous layer 128a may be made of a different material from the matrix 132 of the composite layer 128b and the insulating layers 136 of the multilayer structure 128c.

Figure 14F:
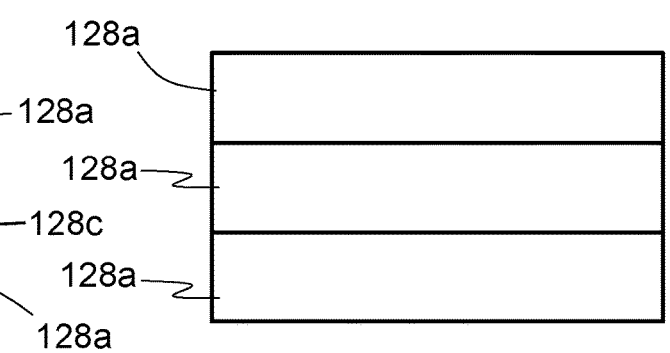

FIG. 14F illustrates yet still another exemplary structure including three homogeneous layers 128a. The three homogeneous layers 128a may be made of different materials and/or have different dopants if present. In an embodiment, the interposing homogenous layer 128a is made of a different material from the two peripheral homogeneous layers 128a, which may be made of the same material and/or have the same dopant if present.

The stacking order of the volatile switching layers in the exemplary structures illustrated in FIGS. 14A-14F may be inverted.

Referring back to FIG. 10, the first electrode structure 124 and the second electrode structure 126 of the selector element 122 each may include one or more electrode layers. FIGS. 15A-15E show partial views of the selector element 122 including the volatile switching layer structure 128 and various exemplary structures for the first electrode structure 124.

Figure 15A:
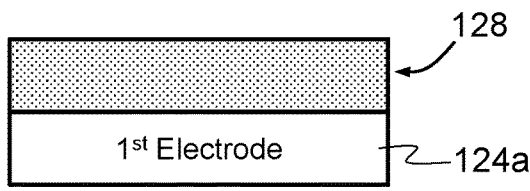
FIGS. 15A-15E are cross sectional views showing exemplary structures for the first electrode structure of FIG. 10 having one, two, three, four, and five first electrode layers, respectively.

FIG. 15A illustrates an exemplary structure for the first electrode structure 124 that includes a first electrode layer 124a formed adjacent to the volatile switching layer structure 128.

Figure 15B:
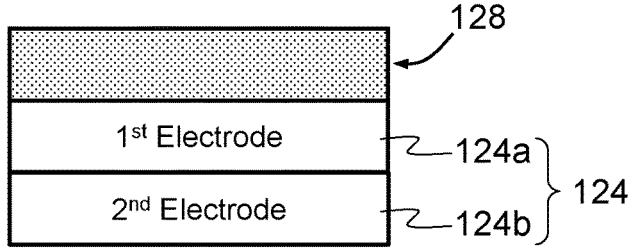

FIG. 15B illustrates another exemplary structure for the first electrode structure 124 that includes the first electrode layer 124a formed adjacent to the volatile switching layer structure 128 and a second electrode layer 124b formed adjacent to the first electrode layer 124a opposite the volatile switching layer structure 128.

Figure 15C:
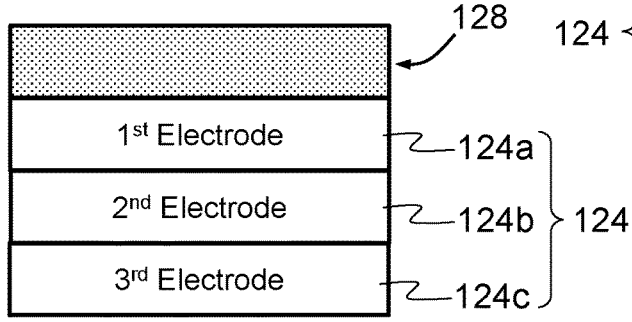

FIG. 15C illustrates still another exemplary structure for the first electrode structure 124 that includes the first electrode layer 124a formed adjacent to the volatile switching layer structure 128, the second electrode layer 124b formed adjacent to the first electrode layer 124a opposite the volatile switching layer structure 128, and a third electrode layer 124c formed adjacent to the second electrode layer 124b opposite the first electrode layer 124a.

Figure 15D:
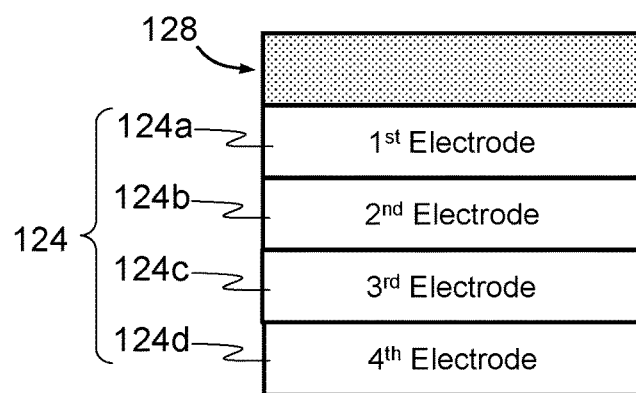

FIG. 15D illustrates yet another exemplary structure for the first electrode structure 124 that includes the first electrode layer 124a formed adjacent to the volatile switching layer structure 128, the second electrode layer 124b formed adjacent to the first electrode layer 124a opposite the volatile switching layer structure 128, the third electrode layer 124c formed adjacent to the second electrode layer 124b opposite the first electrode layer 124a, and a fourth electrode layer 124d formed adjacent to the third electrode layer 124c opposite the second electrode layer 124b.

Figure 15E:
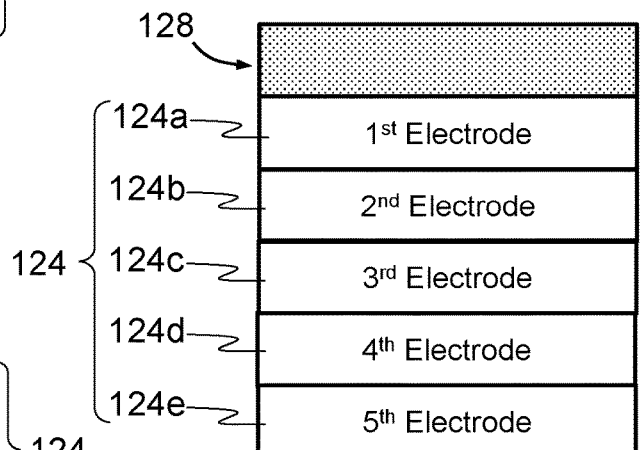

FIG. 15E illustrates still yet another exemplary structure for the first electrode structure 124 that includes the first electrode layer 124a formed adjacent to the volatile switching layer structure 128, the second electrode layer 124b formed adjacent to the first electrode layer 124a opposite the volatile switching layer structure 128, the third electrode layer 124c formed adjacent to the second electrode layer 124b opposite the first electrode layer 124a, the fourth electrode layer 124d formed adjacent to the third electrode layer 124c opposite the second electrode layer 124b, and a fifth electrode layer 124e formed adjacent to the fourth electrode layer 124d opposite the third electrode layer 124c.

The first, second, third, fourth, and fifth electrode layers 124a-124e of the first electrode structure 124 each may include one or more of the following elements: Au, Ag, Cu, Pt, Pd, Ni, Ir, Rh, Co, Os, Ru, Fe, Re, Mn, W, Mo, Cr, Ta, Nb, V, Hf, Zr, Ti, Mg, Zn, Cd, In, Ga, Al, B, Pb, Sn, Ge, Si, C, Bi, Sb, As, N, Te, Se, and O to form a suitable conductor material, such as but not limited to Au, Ag, Pt, Pd, Rh, Ir, Ru, Re, Si, Ni, NiSi$_x$, NiCr$_x$, Cu, CuSi$_x$, CuGe$_x$, CuAl$_x$, CuN$_x$, Co, CoSi$_x$, CoCr$_x$, Zn, ZnN$_x$, Fe, FeNi$_x$Cr$_y$, Cr, CrSi$_x$Al, AlN$_x$, Ti, TiSi$_x$, TiN$_x$, Ta, TaSi$_x$, TaN$_x$, W, WSi$_x$, WN$_x$, Mo, MoSi$_x$, MoN$_x$, Zr, ZrSi$_x$, ZrN$_x$, Hf, HfSi$_x$, HfN$_x$, Nb, NbSi$_x$, NbN$_x$, V, VSi$_x$, VN$_x$, TiAl$_x$, NiAl$_x$, CoAl$_x$, or any combination thereof.

One or more of the first, second, third, fourth, and fifth electrode layers 124a-124e of the first electrode structure 124 each may alternatively have a multilayer structure formed by interleaving one or more layers of a first material with one or more layers of a second material. The first and second materials each may include one or more of the following elements: Au, Ag, Cu, Pt, Pd, Ni, Ir, Rh, Co, Os, Ru, Fe, Re, Mn, W, Mo, Cr, Ta, Nb, V, Hf, Zr, Ti, Mg, Zn, Cd, In, Ga, Al, B, Pb, Sn, Ge, Si, C, Bi, Sb, As, N, Te, Se, and O to form a suitable conductive material, such as but not limited to Au, Ag, Pt, Pd, Rh, Ir, Ru, Re, Si, Ni, NiSi$_x$, NiCr$_x$, Cu, CuSi$_x$, CuGe$_x$, CuAl$_x$, CuN$_x$, Co, CoSi$_x$, CoCr$_x$, Zn, ZnN$_x$, Fe, FeNi$_x$Cr$_y$, Cr, CrSi$_x$Al, AlN$_x$, Ti, TiSi$_x$, TiN$_x$, Ta, TaSi$_x$, TaN$_x$, W, WSi$_x$, WN$_x$, Mo, MoSi$_x$, MoN$_x$, Zr, ZrSi$_x$, ZrN$_x$, Hf, HfSi$_x$, HfN$_x$, Nb, NbSi$_x$, NbN$_x$, V, VSi$_x$, VN$_x$, TiAl$_x$, NiAl$_x$, CoAl$_x$, or any combination thereof.

Figure 16A:
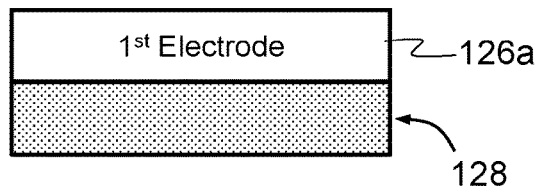
FIGS. 16A-16E are cross sectional views of exemplary structures for the second electrode structure of FIG. 10 having one, two, three, four, and five second electrode layers, respectively.

FIGS. 16A-16E show partial views of the selector element 122 including the volatile switching layer structure 128 and various exemplary structures for the second electrode structure 126. FIG. 16A illustrates an exemplary structure for the second electrode structure 126 that includes a first electrode layer 126a formed adjacent to the volatile switching layer structure 128.

Figure 16B:
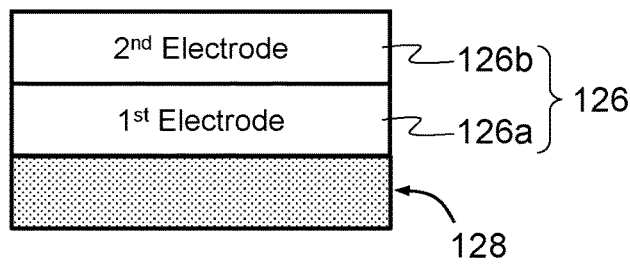

FIG. 16B illustrates another exemplary structure for the second electrode structure 126 that includes the first electrode layer 126a formed adjacent to the volatile switching layer structure 128 and a second electrode layer 126b formed adjacent to the first electrode layer 126a opposite the switching layer structure 128.

Figure 16C:
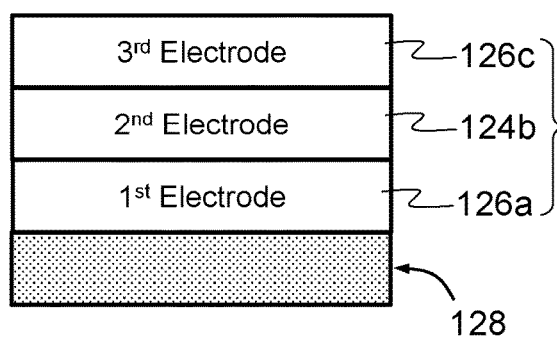

FIG. 16C illustrates still another exemplary structure for the second electrode structure 126 that includes the first electrode layer 126a formed adjacent to the volatile switching layer structure 128, the second electrode layer 126b formed adjacent to the first electrode layer 126a opposite the volatile switching layer structure 128, and a third electrode layer 126c formed adjacent to the second electrode layer 126b opposite the first electrode layer 126a.

Figure 16D:
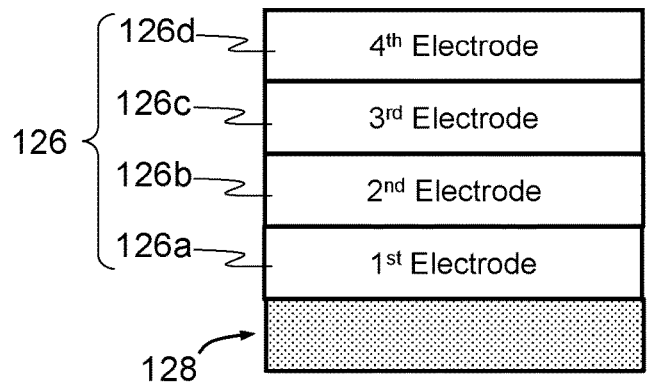

FIG. 16D illustrates yet another exemplary structure for the second electrode structure 126 that includes the first electrode layer 126a formed adjacent to the volatile switching layer structure 128, the second electrode layer 126b formed adjacent to the first electrode layer 126a opposite the volatile switching layer structure 128, the third electrode layer 126c formed adjacent to the second electrode layer 126b opposite the first electrode layer 126a, and a fourth electrode layer 126d formed adjacent to the third electrode layer 126c opposite the second electrode layer 126b.

Figure 16E:
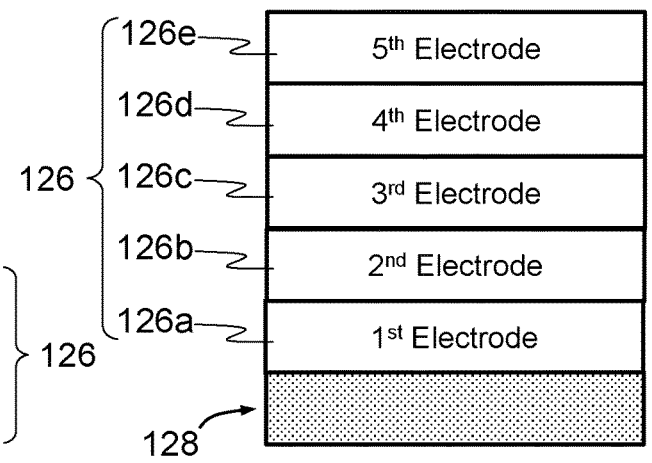

FIG. 16E illustrates still yet another exemplary structure for the second electrode structure 126 that includes the first electrode layer 126a formed adjacent to the volatile switching layer structure 128, the second electrode layer 126b formed adjacent to the first electrode layer 126a opposite the volatile switching layer structure 128, the third electrode layer 126c formed adjacent to the second electrode layer 126b opposite the first electrode layer 126a, the fourth electrode layer 126d formed adjacent to the third electrode layer 126c opposite the second electrode layer 126b, and a fifth electrode layer 126e formed adjacent to the fourth electrode layer 126d opposite the third electrode layer 126c.

The first, second, third, fourth, and fifth electrode layers 126a-126e of the second electrode structure 126 each may include one or more of the following elements: Au, Ag, Cu, Pt, Pd, Ni, Ir, Rh, Co, Os, Ru, Fe, Re, Mn, W, Mo, Cr, Ta, Nb, V, Hf, Zr, Ti, Mg, Zn, Cd, In, Ga, Al, B, Pb, Sn, Ge, Si, C, Bi, Sb, As, N, Te, Se, and O to form a suitable conductive material, such as but not limited to Au, Ag, Pt, Pd, Rh, Ir, Ru, Re, Si, Ni, NiSi$_x$, NiCr$_x$, Cu, CuSi$_x$, CuGe$_x$, CuAl$_x$, CuN$_x$, Co, CoSi$_x$, CoCr$_x$, Zn, ZnN$_x$, Fe, FeNi$_x$Cr$_y$, Cr, CrSi$_x$Al, AlN$_x$, Ti, TiSi$_x$, TiN$_x$, Ta, TaSi$_x$, TaN$_x$, W, WSi$_x$, WN$_x$, Mo, MoSi$_x$, MoN$_x$, Zr, ZrSi$_x$, ZrN$_x$, Hf, HfSi$_x$, HfN$_x$, Nb, NbSi$_x$, NbN$_x$, V, VSi$_x$, VN$_x$, TiAl$_x$, NiAl$_x$, CoAl$_x$, or any combination thereof.

One or more of the first, second, third, fourth, and fifth electrode layers 126a-126e of the second electrode structure 126 each may alternatively have a multilayer structure formed by interleaving one or more layers of a first material with one or more layers of a second material. The first and second materials each may include one or more of the following elements: Au, Ag, Cu, Pt, Pd, Ni, Ir, Rh, Co, Os, Ru, Fe, Re, Mn, W, Mo, Cr, Ta, Nb, V, Hf, Zr, Ti, Mg, Zn, Cd, In, Ga, Al, B, Pb, Sn, Ge, Si, C, Bi, Sb, As, N, Te, Se, and O to form a suitable conductive material, such as but not limited to Au, Ag, Pt, Pd, Rh, Ir, Ru, Re, Si, Ni, NiSi$_x$, NiCr$_x$, Cu, CuSi$_x$, CuGe$_x$, CuAl$_x$, CuN$_x$, Co, CoSi$_x$, CoCr$_x$, Zn, ZnN$_x$, Fe, FeNi$_x$Cr$_y$, Cr, CrSi$_x$Al, AlN$_x$, Ti, TiSi$_x$, TiN$_x$, Ta, TaSi$_x$, TaN$_x$, W, WSi$_x$, WN$_x$, Mo, MoSi$_x$, MoN$_x$, Zr, ZrSi$_x$, ZrN$_x$, Hf, HfSi$_x$, HfN$_x$, Nb, NbSi$_x$, NbN$_x$, V, VSi$_x$, VN$_x$, TiAl$_x$, NiAl$_x$, CoAl$_x$, or any combination thereof.

Referring again to FIG. 10, the first electrode structure 124 and the second electrode structure 126 of the selector element 122 may have a "asymmetric" configuration, whereby the two electrode structures 124 and 126 have different numbers of electrode layers and/or different conductive materials for comparable electrode layers (e.g., the first electrode layer 124a and the first electrode layer 126a are made of different materials). The asymmetric configuration of the first and second electrode structures 124 and 126 may result in the selector element 122 exhibiting the asymmetric I-V response characteristics shown in FIG. 7 or FIG. 8. For example and without limitation, an asymmetric selector element 122 may comprise a first electrode structure 124 that includes a first electrode layer 124a made of silver, a second electrode structure 126 that includes a first electrode layer 126a made of copper, and a volatile switching layer structure 128 including a plurality of silver particles or clusters 130 embedded in a hafnium oxide matrix 132 as illustrated in FIG. 11B or at least one layer of silver 134 interleaved with two or more layers of hafnium oxide 136 as illustrated in FIG. 11C. The second electrode structure 126 of the above exemplary asymmetric selector element may alternatively include a first electrode layer 126a made of titanium nitride and a second electrode layer 126b made of silver. In an embodiment, the plurality of metal-rich particles or clusters 130 or the conductor layers 134 in the volatile switching layer structure 128 are made of the same material as at least one electrode layer in at least one of the first and second electrode structures 124 and 126. For example and without limitation, the plurality of metal-rich particles or clusters 130 and the second electrode layer 126b of the second electrode structure 126 both may be made of Ag, Cu, Co, Ni, or any combination thereof.

The first electrode structure 124 and the second electrode structure 126 of the selector element 122 may alternatively have a "symmetric" configuration, whereby the two electrode structures 124 and 126 have the same number of electrode layers and the same conductive material for comparable electrode layers (i.e., the first electrode layer 124a and the first electrode layer 126a are made of the same material, the second electrode layer 124b and the second electrode layer 126b are made of the same material, and so on). The symmetric configuration of the first and second electrode structures 124 and 126 may result in the selector element exhibiting the symmetric I-V response characteristics shown in FIG. 5A or FIG. 5B.

In an embodiment for the selector element 122 with the symmetric electrode configuration, the volatile switching layer structure 128 includes a plurality of metal-rich particles or clusters 130 embedded in a matrix 132. The metal-rich particles or clusters 130 are made of Ag, Au, Ni, Cu, Co, As, or any combination thereof, while the matrix 132 is made of HfO$_x$, ZrO$_x$, TiO$_x$, NiO$_x$, YO$_x$, AlO$_x$, MgO$_x$, TaO$_x$, SiO$_x$, or any combination thereof. The volatile switching layer structure 128 may have an alternative structure that includes one or more conductive layers 134 interleaved with two or more insulating layers 136. The conductive layers 134 are made of Ag, Au, Ni, Cu, Co, Ta, As, or any combination thereof, while the insulating layers 136 are made of HfO$_x$, ZrO$_x$, TiO$_x$, TaO$_x$, NiO$_x$, YO$_x$, AlO$_x$, MgO$_x$, SiO$_x$, or any combination thereof. The first and second electrode structures 124 and 126 of the selector element 122 with the symmetric electrode configuration include the first electrode layers 124a and 126a made of a material that may interact with defects or ions in the volatile switching layer structure 128 in the presence of an electric field, such as but not limited to Ag, Au, Ni, Cu, Co, Ta, Ti, Al, or any combination thereof, thereby acting as "active" electrodes. The first and second electrode structures 124 and 126 may further include the second electrode layers 124b and 126b that may be relatively inert with respect to the defects or ions in the volatile switching layer structure 128, such as but not limited to Pt, Pd, Rh, Ir, Ru, Re, Ta, TiN$_x$, ZrN$_x$, HfN$_x$, TaN$_x$, NbN$_x$, TiSi$_x$, CoSi$_x$, NiSi$_x$, or any combination thereof, thereby acting as "inert" electrodes.

In another embodiment for the selector element 122 with the symmetric electrode configuration, the volatile switching layer structure 128 includes a plurality of metal-rich particles or clusters 130 embedded in a matrix 132. The metal-rich particles or clusters 130 are made of Ag, Au, Ni, Cu, Co, As, or any combination thereof, while the matrix 132 is made of HfO$_x$, ZrO$_x$, TiO$_x$, NiO$_x$, YO$_x$, AlO$_x$, MgO$_x$, TaO$_x$, SiO$_x$, or any combination thereof. The volatile switching layer structure 128 may have an alternative structure that includes one or more conductive layers 134 interleaved with two or more insulating layers 136. The conductive layers 134 are made of Ag, Au, Ni, Cu, Co, Ta, As, or any combination thereof, while the insulating layers 136 are made of $HfO_x$, $ZrO_x$, $TiO_x$, $TaO_x$, $NiO_x$, $YO_x$, $AlO_x$, $MgO_x$, $SiO_x$, or any combination thereof. The first and second electrode structures 124 and 126 of the selector element 122 with the symmetric electrode configuration include the first electrode layers 124a and 126a made of a material that may be relatively inert and may not interact with defects or ions in the volatile switching layer structure 128 in the presence of an electric field, such as but not limited to Pt, Pd, Rh, Ir, Ru, Re, Ta, $TiN_x$, $ZrN_x$, $HfN_x$, $TaN_x$, $NbN_x$, $TiSi_x$, $CoSi_x$, $NiSi_x$, or any combination thereof; and the second electrode layers 124b and 126b that may act as active electrodes and are made of a material that may interact with defects or ions in the volatile switching layer structure 128 in the presence of an electric field, such as but not limited to Ag, Au, Ni, Cu, Co, Ta, Ti, Al, or any combination thereof. In addition to being relatively inert, the first electrode layers 124a and 126a may serve as diffusion barrier for the movement of defects or ions between the volatile switching layer structure 128 and the second electrode layers 124b and 126b. The first and second electrode structures 124 and 126 may further include the third electrode layers 124c and 126c that may be relatively inert and may not interact with defects or ions in the volatile switching layer structure 128. For example and without limitation, the third electrode layers 124c and 126c may be made of Pt, Pd, Rh, Ir, Ru, Re, Ta, $TiN_x$, $ZrN_x$, $HfN_x$, $TaN_x$, $NbN_x$, $TiSi_x$, $CoSi_x$, $NiSi_x$, or any combination thereof.

In still another embodiment for the selector element 122 with the symmetric electrode configuration, the plurality of metal-rich particles or clusters 130 or the conductive layers 134 in the volatile switching layer structure 128 are made of the same material as at least one electrode layer in the first and second electrode structures 124 and 126. For example and without limitation, the plurality of metal-rich particles or clusters 130 and the second electrode layers 124b and 126b may be made of Ag, Cu, Co, Ni, or any combination thereof.

FIG. 17A shows an exemplary structure 190 for the MTJ memory element that includes a magnetic free layer structure 200 and a magnetic reference layer structure 202 with a tunnel junction layer 204 interposed therebetween. The magnetic free layer structure 200 has a variable magnetization direction 206 substantially perpendicular to the layer plane thereof. The magnetic reference layer structure 202 has a first invariable magnetization direction 208 substantially perpendicular to the layer plane thereof. The magnetic free layer structure 200, the tunnel junction layer 204, and the magnetic reference layer structure 202 collectively form a magnetic tunnel junction structure 210. The exemplary structure 190 may further include a magnetic fixed layer structure 212 exchange coupled to the magnetic reference layer structure 202 through an anti-ferromagnetic coupling layer 214. The magnetic fixed layer structure 212 has a second invariable magnetization direction 216 that is substantially perpendicular to the layer plane thereof and is substantially opposite to the first invariable magnetization direction 208 of the magnetic reference layer structure 202. In an embodiment, the switching voltage of the exemplary structure 190 from the low resistance state to the high resistance state is substantially same as the switching voltage from the high resistance state to the low resistance state by adjusting the offset field, which is the net external magnetic field acting on the magnetic free layer structure 200 along the direction of perpendicular magnetization 208. In another embodiment, the stray magnetic fields exerted on the magnetic free layer structure 200 by the magnetic reference and fixed layer structures 202 and 212, respectively, substantially cancel each other, thereby rendering the offset field to be substantially zero or negligible. The stacking order of the layers 212, 214, 202, 204, and 200 in the exemplary structure 190 may be inverted as shown in FIG. 17B.

Another exemplary structure 220 for the MTJ memory element, as illustrated in FIG. 17C, includes the magnetic tunnel junction structure 210 and a magnetic compensation layer structure 222 separated from the magnetic free layer structure 200 by a non-magnetic spacer layer 224. The magnetic compensation layer structure 222 has a third invariable magnetization direction 226 that is substantially perpendicular to the layer plane thereof and is substantially opposite to the first invariable magnetization direction 208 of the magnetic reference layer structure 202. The magnetic compensation layer structure 222 may be used to generate a magnetic field opposing that exerted by the magnetic fixed layer structure 202 on the magnetic free layer structure 200. In an embodiment, the switching voltage of the exemplary structure 220 from the low resistance state to the high resistance state is substantially same as the switching voltage from the high resistance state to the low resistance state by adjusting the offset field. In another embodiment, the stray magnetic fields exerted on the magnetic free layer structure 200 by the magnetic reference and compensation layer structures 202 and 222, respectively, substantially cancel each other, thereby rendering the offset field to be substantially zero or negligible. The stacking order of the layers 202, 204, 200, 224, and 222 in the exemplary structure 220 may be inverted as shown in FIG. 17D.

Figure 18A:
FIGS. 18A-18G are cross sectional views showing exemplary structures for the magnetic free layer structure illustrated in FIGS. 17A-17D.

The magnetic free layer structure 200 of the exemplary structures 190, 190', 220, and 220' may include one or more magnetic layers with each layer having the variable magnetization direction 206 as illustrated by the exemplary embodiments shown in FIGS. 18A-18G. FIG. 18A shows that the magnetic free layer structure 200 includes a first magnetic free layer 252, which has the variable magnetization direction 206, formed adjacent to the tunnel junction layer 204.

Figure 18B:
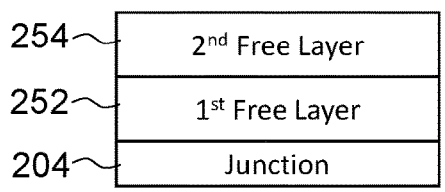

FIG. 18B shows the magnetic free layer structure 200 including a first magnetic free layer 252 formed adjacent to the tunnel junction layer 204 and a second magnetic free layer 254 formed adjacent to the first magnetic free layer 252 opposite the tunnel junction layer 204. Each of the first and second magnetic free layers 252 and 254 has the variable magnetization direction 206. The exemplary magnetic free layer structure of FIG. 18B may further include a non-magnetic perpendicular enhancement layer (PEL) 258 interposed between the first and second magnetic free layers 252 and 254 as illustrated in FIG. 18D.

Figure 18C:
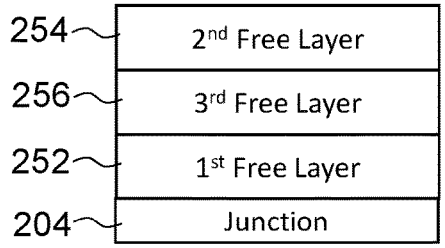
Figure 18D:
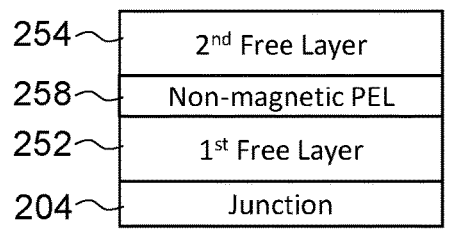

The magnetic free layer structure 200 may include three magnetic free layers 252-256 as illustrated in FIG. 18C. A first magnetic free layer 252 is formed adjacent to the tunnel junction layer 204. A third magnetic free layer 256 is formed adjacent to the first magnetic free layer 252 opposite the tunnel junction layer 204. A second magnetic free layer 254 is formed adjacent to the third magnetic free layer 256 opposite the first magnetic free layer 252. Each of the first, second, and third magnetic free layers 252-256 has the variable magnetization direction 206.

Figure 18E:
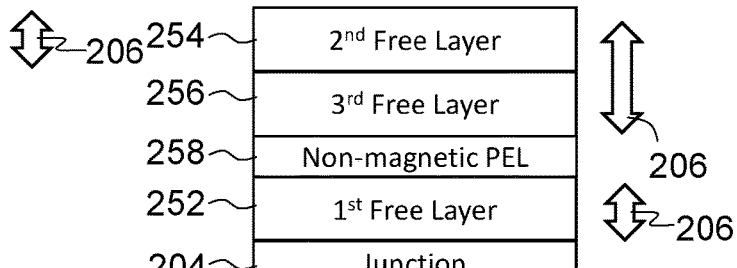
Figure 18F:
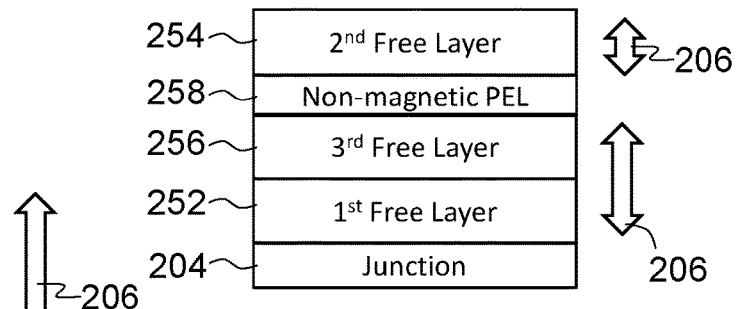
Figure 18G:
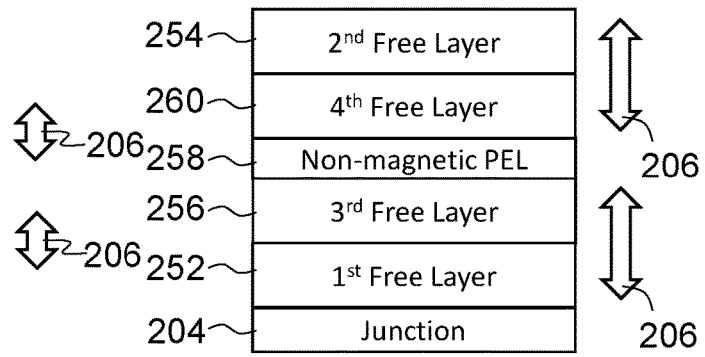

The exemplary magnetic free layer structure of FIG. 18C may further include a non-magnetic perpendicular enhancement layer (PEL) 258 interposed between the first and third magnetic free layers 252 and 256 as illustrated in FIG. 18E. Alternatively, the exemplary magnetic free layer structure of FIG. 18C may further include a non-magnetic perpendicular enhancement layer (PEL) 258 interposed between the second and third magnetic free layers 254 and 256 as illustrated in FIG. 18F. The exemplary magnetic free layer structure of FIG. 18F may be further modified to include a fourth magnetic free layer 260, which has the variable magnetization direction 206, interposed between the non-magnetic PEL 258 and the second magnetic free layer 254 as illustrated in FIG. 18G.

The exemplary magnetic free layer structures of FIGS. 18A-18G may be formed above the tunnel junction layer 204 as shown in FIGS. 17A and 17C, or beneath the tunnel junction layer 204 as shown in FIGS. 17B and 17D. In the latter case, the stacking sequence of the layers in the exemplary magnetic free layer structures of FIGS. 18A-18G will be inverted.

The magnetic free layer structure 200 is not limited to the exemplary structures of FIGS. 18A-18G and may have other structures that include multiple magnetic free layers and optionally one or more PELs. For example and without limitation, the magnetic free layer structure 200 may include four magnetic free layers without any PEL.

Figure 19A:
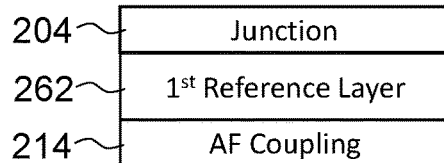
FIGS. 19A-19G are cross sectional views showing exemplary structures for the magnetic reference layer structure illustrated in FIGS. 17A-17D.

The magnetic reference layer structure 202 of the exemplary structures 190, 190', 220, and 220' may include one or more magnetic layers with each layer having the first invariable magnetization direction 208 as illustrated by the exemplary embodiments shown in FIGS. 19A-19G. FIG. 19A shows that the magnetic reference layer structure 202 includes a first magnetic reference layer 262, which has the first invariable magnetization direction 208, formed between the tunnel junction layer 204. The anti-ferromagnetic coupling layer 214, if present, may form adjacent to the first magnetic reference layer 262.

Figure 19B:
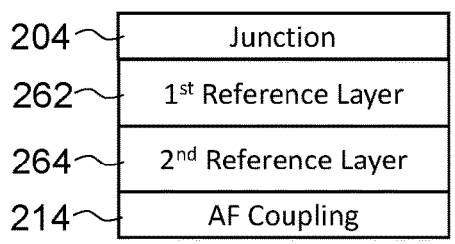

FIG. 19B shows the magnetic reference layer structure 202 including a first magnetic reference layer 262 formed adjacent to the tunnel junction layer 204 and a second magnetic reference layer 264 formed adjacent to the first magnetic reference layer 262 opposite the tunnel junction layer 204. The anti-ferromagnetic coupling layer 214, if present, may form adjacent to the second magnetic reference layer 264 opposite the first magnetic reference layer 262. Each of the first and second magnetic reference layers 262 and 264 has the first invariable magnetization direction 208. The exemplary magnetic reference layer structure of FIG. 19B may further include a non-magnetic perpendicular enhancement layer (PEL) 268 interposed between the first and second magnetic reference layers 262 and 264 as illustrated in FIG. 19D.

Figure 19C:
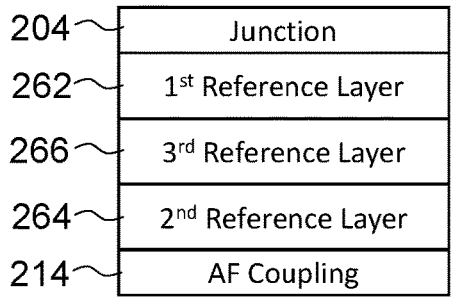
Figure 19D:
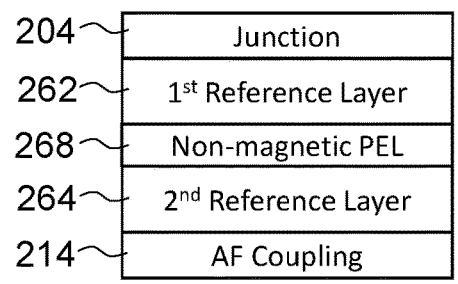

The magnetic reference layer structure 202 may include three magnetic reference layers 262-266 as illustrated in FIG. 19C. A first magnetic reference layer 262 is formed adjacent to the tunnel junction layer 204. A third magnetic reference layer 266 is formed adjacent to the first magnetic reference layer 262 opposite the tunnel junction layer 204. A second magnetic reference layer 264 is formed adjacent to the third magnetic reference layer 266 opposite the first magnetic reference layer 262. The anti-ferromagnetic coupling layer 214, if present, may form adjacent to the second magnetic reference layer 264 opposite the third magnetic reference layer 266. Each of the first, second, and third magnetic reference layers 262-266 has the first invariable magnetization direction 208.

Figure 19E:
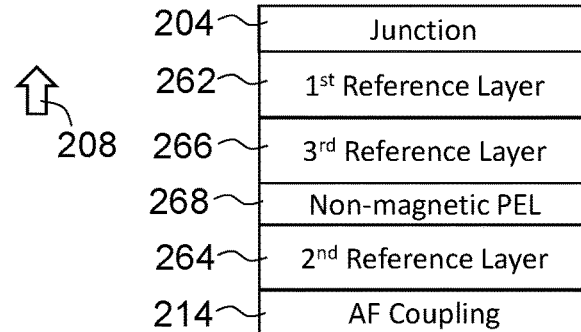
Figure 19F:
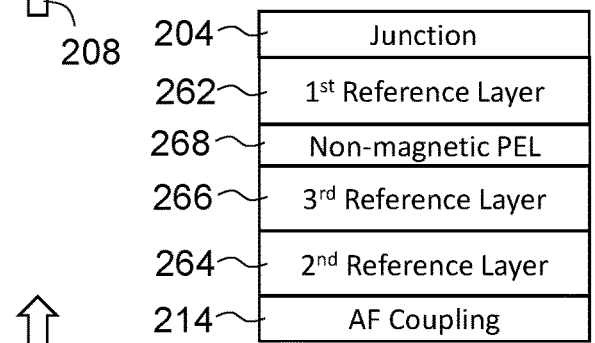
Figure 19G:
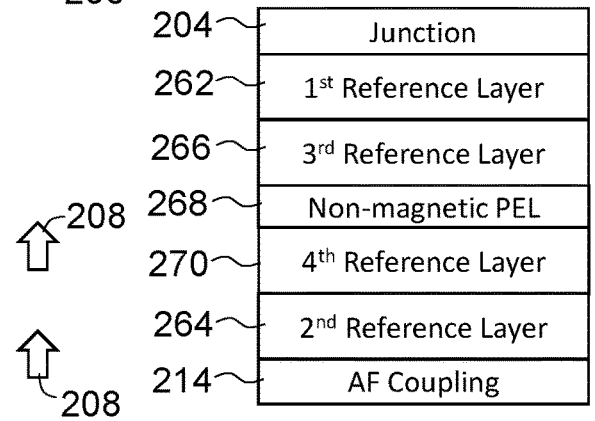

The exemplary magnetic reference layer structure of FIG. 19C may further include a non-magnetic perpendicular enhancement layer (PEL) 268 interposed between the first and third magnetic reference layers 262 and 266 as illustrated in FIG. 19F. Alternatively, the exemplary magnetic reference layer structure of FIG. 19C may further include a non-magnetic perpendicular enhancement layer (PEL) 268 interposed between the second and third magnetic reference layers 264 and 266 as illustrated in FIG. 19E. The exemplary magnetic reference layer structure of FIG. 19E may be further modified to include a fourth magnetic reference layer 270, which has the first invariable magnetization direction 208, interposed between the non-magnetic PEL 268 and the second magnetic reference layer 264 as illustrated in FIG. 19G.

The exemplary magnetic reference layer structures of FIGS. 19A-19G may be formed beneath the tunnel junction layer 204 as shown in FIGS. 17A and 17C, or above the tunnel junction layer 204 as shown in FIGS. 17B and 17D. In the latter case, the stacking sequence of the layers in the exemplary magnetic reference layer structures of FIGS. 19A-19G will be inverted.

The magnetic reference layer structure 202 is not limited to the exemplary structures of FIGS. 19A-19G and may have other structures that include multiple magnetic reference layers and optionally one or more PELs. For example and without limitation, the magnetic reference layer structure 202 may include four magnetic reference layers without any PEL.

Figure 20A:
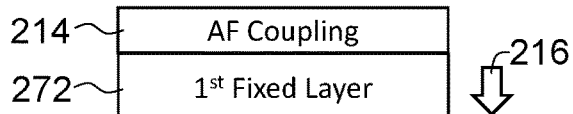
FIGS. 20A-20G are cross sectional views showing exemplary structures for the magnetic fixed layer structure illustrated in FIGS. 17A-17B.

The magnetic fixed layer structure 212 of the exemplary structures 190 and 190' may include one or more magnetic layers with each layer having the second invariable magnetization direction 216 as illustrated by the exemplary embodiments shown in FIGS. 20A-20G. FIG. 20A shows that the magnetic fixed layer structure 212 includes a first magnetic fixed layer 272, which has the second invariable magnetization direction 216, formed adjacent to the anti-ferromagnetic coupling layer 214.

Figure 20B:
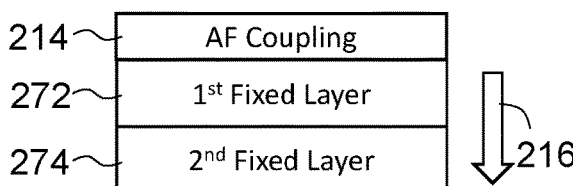

FIG. 20B shows the magnetic fixed layer structure 212 including a first magnetic fixed layer 272 formed adjacent to the anti-ferromagnetic coupling layer 214 and a second magnetic fixed layer 274 formed adjacent to the first magnetic fixed layer 272 opposite the anti-ferromagnetic coupling layer 214. Each of the first and second magnetic fixed layers 272 and 274 has the second invariable magnetization direction 216. The exemplary magnetic fixed layer structure of FIG. 20B may further include a non-magnetic perpendicular enhancement layer (PEL) 278 interposed between the first and second magnetic fixed layers 272 and 274 as illustrated in FIG. 20D.

Figure 20C:
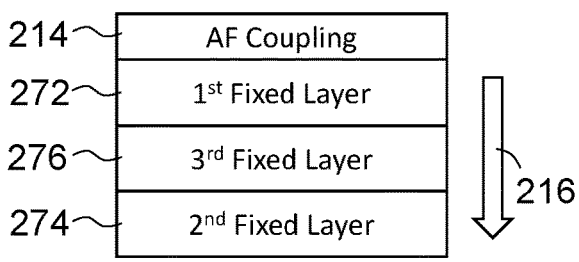
Figure 20D:
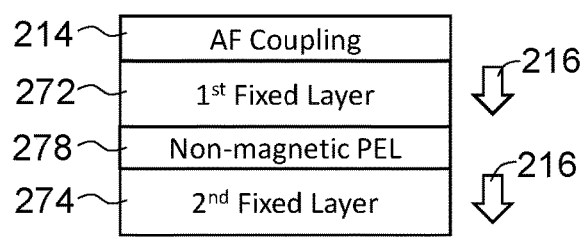

The magnetic fixed layer structure 212 may include three magnetic fixed layers 272-276 as illustrated in FIG. 20C. A first magnetic fixed layer 272 is formed adjacent to the anti-ferromagnetic coupling layer 214. A third magnetic fixed layer 276 is formed adjacent to the first magnetic fixed layer 272 opposite the anti-ferromagnetic coupling layer 214. A second magnetic fixed layer 274 is formed adjacent to the third magnetic fixed layer 276 opposite the first magnetic fixed layer 272. Each of the first, second, and third magnetic fixed layers 272-276 has the second invariable magnetization direction 216.

Figure 20E:
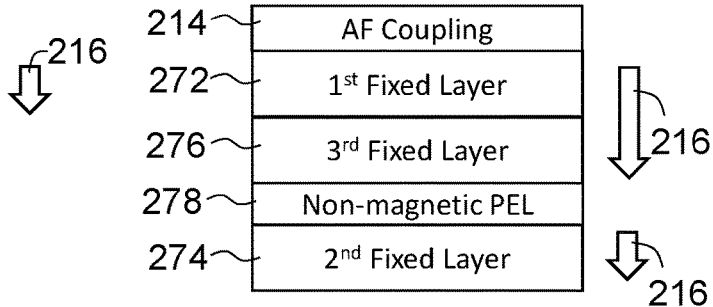
Figure 20F:
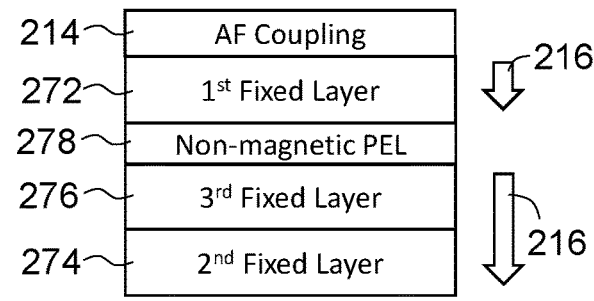
Figure 20G:
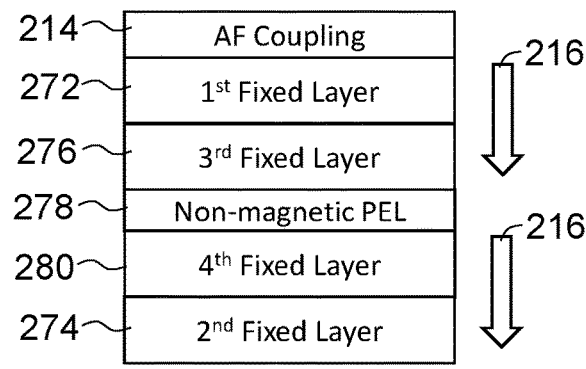

The exemplary magnetic fixed layer structure of FIG. 20C may further include a non-magnetic perpendicular enhancement layer (PEL) 278 interposed between the first and third magnetic fixed layers 272 and 276 as illustrated in FIG. 20F. Alternatively, the exemplary magnetic fixed layer structure of FIG. 20C may further include a non-magnetic perpendicular enhancement layer (PEL) 278 interposed between the second and third magnetic fixed layers 274 and 276 as illustrated in FIG. 20E. The exemplary magnetic fixed layer structure of FIG. 20E may be further modified to include a fourth magnetic fixed layer 280, which has the second invariable magnetization direction 216, interposed between the non-magnetic PEL 278 and the second magnetic fixed layer 274 as illustrated in FIG. 20G.

The exemplary magnetic fixed layer structures of FIGS. 20A-20G may be formed beneath the anti-ferromagnetic coupling layer 214 as shown in FIG. 17A, or above the anti-ferromagnetic coupling layer 214 as shown in FIG. 17B. In the latter case, the stacking sequence of the layers in the exemplary magnetic fixed layer structures of FIGS. 20A-20G will be inverted.

The magnetic fixed layer structure 212 is not limited to the exemplary structures of FIGS. 20A-20G and may have other structures that include multiple magnetic fixed layers and optionally one or more PELs. For example and without limitation, the magnetic fixed layer structure 212 may include four magnetic fixed layers without any PEL.

Figure 21A:
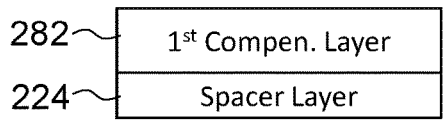
FIGS. 21A-21G are cross sectional views showing exemplary structures for the magnetic compensation layer structure illustrated in FIGS. 17C-17D.

The magnetic compensation layer structure 222 of the exemplary structures 220 and 220' may include one or more magnetic layers with each layer having the third invariable magnetization direction 226 as illustrated by the exemplary structures shown in FIGS. 21A-21G. FIG. 21A shows that the magnetic compensation layer structure 222 includes a first magnetic compensation layer 282, which has the third fixed magnetization direction 226, formed adjacent to the spacer layer 224.

Figure 21E:
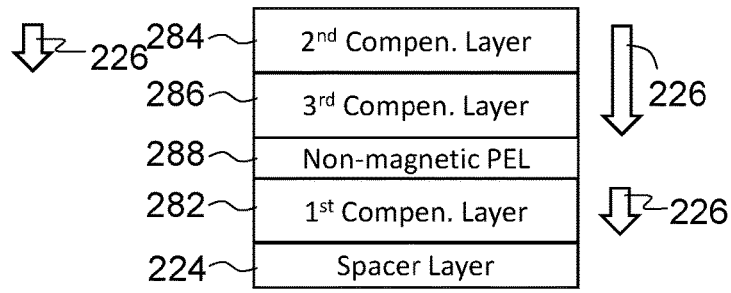
Figure 21B:
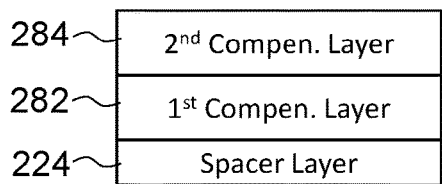

FIG. 21B shows the magnetic compensation layer structure 222 including a first magnetic compensation layer 282 formed adjacent to the spacer layer 224 and a second magnetic compensation layer 284 formed adjacent to the first magnetic compensation layer 282 opposite the spacer layer 224. Each of the first and second magnetic compensation layers 282 and 284 has the third invariable magnetization direction 226. The exemplary magnetic compensation layer structure of FIG. 21B may further include a non-magnetic perpendicular enhancement layer (PEL) 288 interposed between the first and second magnetic compensation layers 282 and 284 as illustrated in FIG. 21D.

Figure 21C:
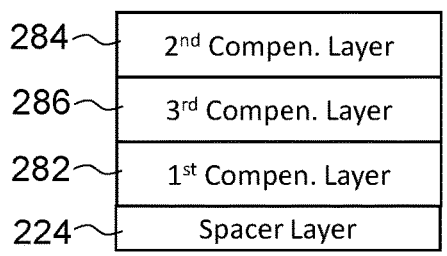

The magnetic compensation layer structure 222 may include three magnetic compensation layers 282-286 as illustrated in FIG. 21C. A first magnetic compensation layer 282 is formed adjacent to the spacer layer 224. A third magnetic compensation layer 286 is formed adjacent to the first magnetic compensation layer 282 opposite the spacer layer 224. A second magnetic compensation layer 284 is formed adjacent to the third magnetic compensation layer 286 opposite the first magnetic compensation layer 282. Each of the first, second, and third magnetic compensation layers 282-286 has the third invariable magnetization direction 226.

Figure 21F:
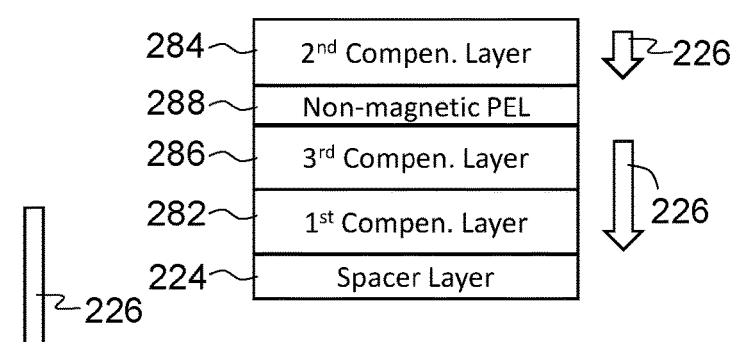
Figure 21D:
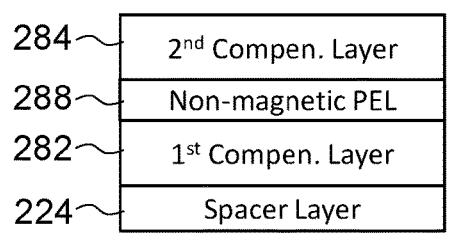
Figure 21G:
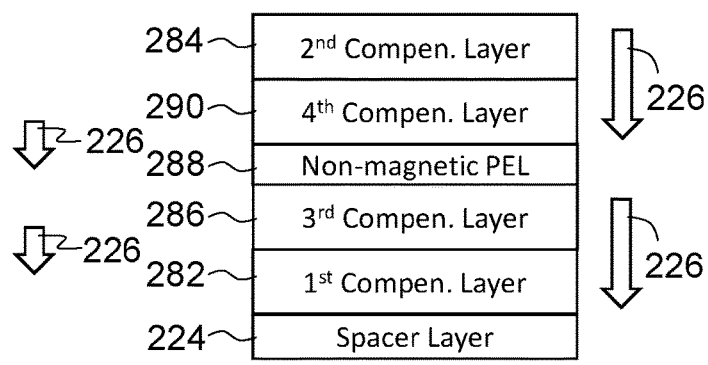

The exemplary magnetic compensation layer structure of FIG. 21C may further include a non-magnetic perpendicular enhancement layer (PEL) 288 interposed between the first and third magnetic compensation layers 282 and 286 as illustrated in FIG. 21E. Alternatively, the exemplary magnetic compensation layer structure of FIG. 21C may further include a non-magnetic perpendicular enhancement layer (PEL) 288 interposed between the second and third magnetic compensation layers 284 and 286 as illustrated in FIG. 21F. The exemplary magnetic compensation layer structure of FIG. 21F may be further modified to include a fourth magnetic compensation layer 290, which has the third invariable magnetization direction 226, interposed between the non-magnetic PEL 288 and the second magnetic compensation layer 284 as illustrated in FIG. 21G.

The exemplary magnetic compensation layer structures of FIGS. 21A-21G may be formed above the spacer layer 224 as shown in FIG. 17C, or beneath the spacer layer 224 as shown in FIG. 17D. In the latter case, the stacking sequence of the layers in the exemplary magnetic free layer structures of FIG. 21A-21G will be inverted.

The magnetic compensation layer structure 222 is not limited to the exemplary structures of FIGS. 21A-21G and may have other structures that include multiple magnetic compensation layers and optionally one or more PELs. For example and without limitation, the magnetic compensation layer structure 222 may include four magnetic compensation layers without any PEL.

The magnetic layers 252-256, 260-266, 270-276, 280-286, and 290 may be made of any suitable magnetic materials or structures. One or more of the magnetic layers 252-256, 260-266, 270-276, 280-286, and 290 each may comprise one or more ferromagnetic elements, such as but not limited to cobalt (Co), nickel (Ni), and iron (Fe), to form a suitable magnetic material, such as but not limited to Co, Ni, Fe, $CoNi_x$, $CoFe_x$, $NiFe_x$, or $CoNi_xFe_y$. The suitable magnetic material for the one or more of the magnetic layers 252-256, 260-266, 270-276, 280-286, and 290 may further include one or more non-magnetic elements, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), ruthenium (Ru), samarium (Sm), neodymium (Nd), antimony (Sb), iridium (Ir) or phosphorus (P), to form a magnetic alloy or compound, such as but not limited to cobalt-iron-boron ($CoFe_xB_y$), iron-platinum ($FePt_x$), cobalt-platinum ($CoPt_x$), cobalt-platinum-chromium ($CoPt_xCr_y$), cobalt-iron-boron-titanium ($CoFe_xB_yTi_z$), cobalt-iron-boron-zirconium ($CoFe_xB_yZr_z$), cobalt-iron-boron-hafnium ($CoFe_xB_yHf_z$), cobalt-iron-boron-vanadium ($CoFe_xB_yV_z$), cobalt-iron-boron-tantalum ($CoFe_xB_yTa_z$), cobalt-iron-boron-chromium ($CoFe_xB_yCr_z$), cobalt-iron-titanium ($CoFe_xTi_y$), cobalt-iron-zirconium ($CoFe_xZr_y$), cobalt-iron-hafnium ($CoFe_xHf_y$), cobalt-iron-vanadium ($CoFe_xV_y$), cobalt-iron-niobium ($CoFe_xNb_y$), cobalt-iron-tantalum ($CoFe_xTa_y$), cobalt-iron-chromium ($CoFe_xCr_y$), cobalt-iron-molybdenum ($CoFe_xMo_y$), cobalt-iron-tungsten ($CoFe_xW_y$), cobalt-iron-aluminum ($CoFe_xAl_y$), cobalt-iron-silicon ($CoFe_xSi_y$), cobalt-iron-germanium ($CoFe_xGe_y$), iron-zirconium-boron ($FeZr_xB_y$), samarium-cobalt ($SmCo_x$), neodymium-iron-boron ($NdFe_xB_y$), cobalt-iron-antimony ($CoFe_xSb_y$), cobalt-iron-iridium ($CoFe_xIr_y$), or cobalt-iron-phosphorous ($CoFe_xP_y$).

Some of the above-mentioned magnetic materials, such as Fe, $CoFe_x$, $CoFe_xB_y$ may have a body-centered cubic (BCC) lattice structure that is compatible with the halite-like cubic lattice structure of $MgO_x$, which may be used as the insulating tunnel junction layer 204. $CoFe_xB_y$ alloy used for one or more of the magnetic layers 252-256, 260-266, 270-276, 280-286, and 290 may contain more than 40 atomic percent Fe or may contain less than 30 atomic percent B or both.

Figure 22A:
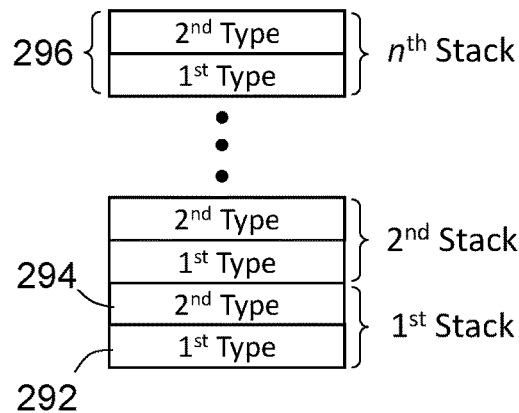
FIGS. 22A-22D are cross sectional views showing exemplary multilayer structures comprising one or more stacks of a bilayer unit structure.
Figure 22C:
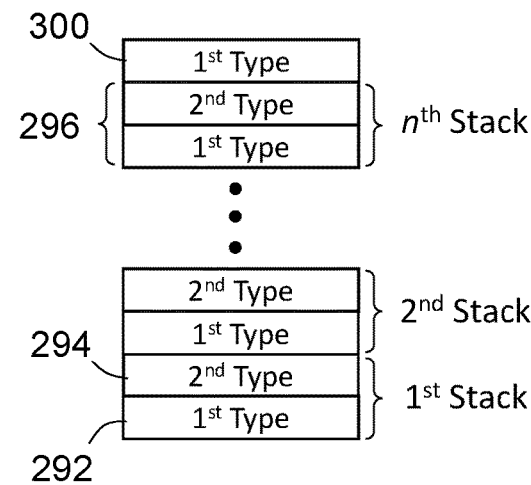
Figure 22B:
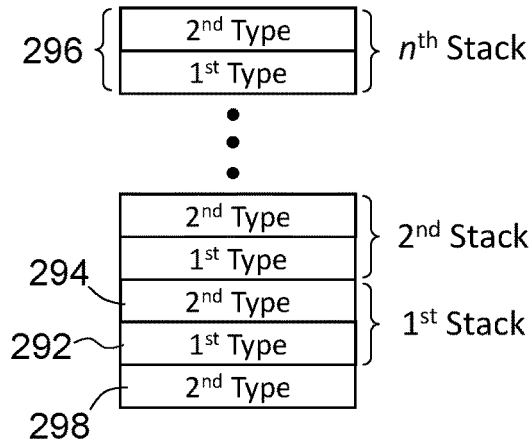
Figure 22D:
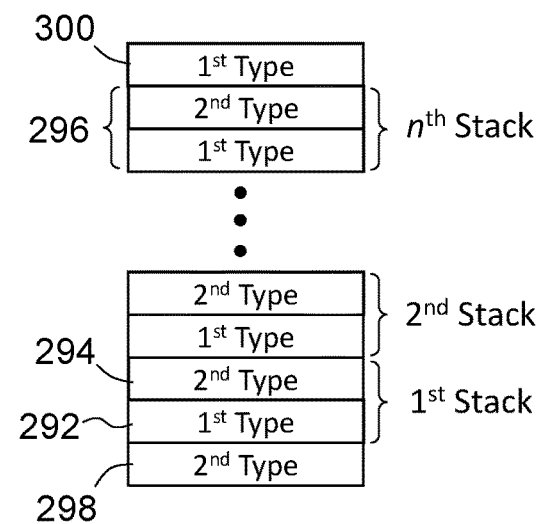

One or more of the magnetic layers 252-256, 260-266, 270-276, 280-286, and 290 each may alternatively have a multilayer structure formed by interleaving one or more layers of a first type of material 292 with one or more layers of a second type of material 294 with at least one of the two types of materials 292 and 294 being magnetic, as illustrated in FIGS. 22A-22D. FIG. 22A shows an exemplary multilayer structure formed by one (n=1) or more stacks of a bilayer unit structure 296, which includes a layer of the first type of material 292 and a layer of the second type of material 294. The multilayer structure for one or more of the magnetic layers 252-256, 260-266, 270-276, 280-286, and 290 may include additional layers formed at the periphery of the exemplary multilayer structure of FIG. 22A. For example and without limitation, the stacks of the bilayer unit structure 296 may include another layer of the second type of material 298 formed adjacent to the first type of material of the first stack as shown in FIG. 22B, or another layer of the first type of material 300 formed adjacent to the second type of material of the $n^{th}$ stack (the end stack) as shown in FIG. 22C, or both as shown in FIG. 22D. The layer of the first type of material 292 in a unit structure 296 may have a different thickness compared with other layers of the first type of material in other unit structures. Similarly, the layer of the second type of material 294 in a unit structure 296 may have a different thickness compared with other layers of the second type of material in other unit structures. The layer thicknesses of the first type of material 300 and the second type of material 298 at the periphery may or may not be same as the layer thicknesses of the first type of material 292 and the second type of material 294 of the bilayer unit structure 296, respectively. One or more layers of the two layers of materials 292-294 may be extremely thin and thus have fragmented coverage and/or are perforated with holes. The stacking sequences of the exemplary multilayer structures of FIGS. 22A-22D may be inverted.

The first type of material 292 and 300 may comprise one or more ferromagnetic elements, such as but not limited to cobalt (Co), nickel (Ni), and iron (Fe), to form a suitable magnetic material, such as but not limited to Co, Ni, Fe, $CoNi_x$, $CoFe_x$, $NiFe_x$, or $CoNi_xFe_y$. The second type of material 294 and 298 may be made of any suitable material, such as but not limited to Pt, Pd, Ni, Ir, Cr, V, Ti, Zr, Hf, Nb, Ta, Mo, W, $NiCr_x$, $NiV_x$, $NiTi_x$, $NiZr_x$, $NiHf_x$, $NiNb_x$, $NiTa_x$, $NiMo_x$, $NiW_x$, or any combination thereof. Therefore, one or more of the magnetic layers 252-256, 260-266, 270-276, 280-286, and 290 may include a multilayer structure, such as but not limited to [Co/Pt], [Co/Pd], [Co/Pt(Pd)], [Co/Ni], [Co/Ir], [$CoFe_x$/Pt], [$CoFe_x$/Pd], [$CoFe_x$/Pt(Pd)], [$CoFe_x$/Ni], [$CoFe_x$/Ir], [Co/$NiCr_x$], or any combination thereof. The multilayer structure may have a face-centered cubic (FCC) type of lattice structure, which is different from the body-centered cubic structure (BCC) of some ferromagnetic materials, such as Fe, $CoFe_x$, and $CoFe_xB_y$, and the halite-like cubic lattice structure of magnesium oxide ($MgO_x$) that may be used as the insulating tunnel junction layer 204. All individual magnetic layers of a magnetic multilayer structure may have the same magnetization direction. The multilayer structure may or may not exhibit the characteristic satellite peaks associated with superlattice when analyzed by X-ray, neutron diffraction, or other diffraction techniques.

The insulating tunnel junction layer 204 of the exemplary structures 190, 190', 220 and 220' in FIGS. 17A-17D, respectively, may be formed of a suitable insulating material containing oxygen, nitrogen, or both, such as but not limited to magnesium oxide ($MgO_x$), aluminum oxide ($AlO_x$), titanium oxide ($TiO_x$), zirconium oxide ($ZrO_x$), hafnium oxide ($HfO_x$), vanadium oxide ($VO_x$), tantalum oxide ($TaO_x$), chromium oxide ($CrO_x$), molybdenum oxide ($MoO_x$), tungsten oxide ($WO_x$), gallium oxide ($GaO_x$), silicon oxide ($SiO_x$), yttrium oxide ($YO_x$), silicon nitride ($SiN_x$), $MgTi_xO_y$, $MgAl_xO_y$, $AlTi_xO_y$, or any combination thereof. The insulating tunnel junction layer 204 may have a composite structure comprising two layers of insulating materials, each of which is made of a suitable insulating material as described above. For example and without limitation, the composite tunnel junction layer may include a layer of magnesium oxide and a layer of titanium oxide.

The anti-ferromagnetic coupling layer 214, which anti-ferromagnetically couples the magnetic fixed layer structure 212 to the magnetic reference layer structure 202 of the exemplary structures 190 and 190' in FIGS. 17A and 17B, respectively, may be made of a suitable coupling material, such as but not limited to ruthenium (Ru), vanadium (V), niobium (Nb), tantalum (Ta), chromium (Cr), molybdenum (Mo), tungsten (W), manganese (Mn), rhenium (Re), osmium (Os), rhodium (Rh), iridium (Ir), copper (Cu), or any combination thereof. The anti-ferromagnetic coupling layer 214 may have a composite structure that includes two or more sublayers. Each of the sublayers may be made of a suitable coupling material described above.

The perpendicular enhancement layers (PELs) 258, 268, 278, and 288 each may comprise one or more of the following elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C, thereby forming a suitable perpendicular enhancement material, such as but not limited to B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, MgO, $TiO_x$, $ZrO_x$, $HfO_x$, $VO_x$, $NbO_x$, $TaO_x$, $CrO_x$, $MoO_x$, $WO_x$, $RhO_x$, $NiO_x$, $PdO_x$, $PtO_x$, $CuO_x$, $AgO_x$, $RuO_x$, $SiO_x$, $TiN_x$, $ZrN_x$, $HfN_x$, $VN_x$, $NbN_x$, $TaN_x$, $CrN_x$, $MoN_x$, $WN_x$, $NiN_x$, $PdN_x$, $PtN_x$, $RuN_x$, $SiN_x$, $TiO_xN_y$, $ZrO_xN_y$, $HfO_xN_y$, $VO_xN_y$, $NbO_xN_y$, $TaO_xN_y$, $CrO_xN_y$, $MoO_xN_y$, $WO_xN_y$, $NiO_xN_y$, $PdO_xN_y$, $PtO_xN_y$, $RuO_xN_y$, $SiO_xN_y$, $TiRu_xO_y$, $ZrRu_xO_y$, $HfRu_xO_y$, $VRu_xO_y$, $NbRu_xO_y$, $TaRu_xO_y$, $CrRu_xO_y$, $MoRu_xO_y$, $WRu_xO_y$, $RhRu_xO_y$, $NiRu_xO_y$, $PdRu_xO_y$, $PtRu_xO_y$, $CuRu_xO_y$, $AgRu_xO_y$, $CoFe_xB_y$, $CoFe_x$, $NiFe_x$, $CoFe_xNi_y$, $CoTi_x$, $CoZr_x$, $CoHf_x$, $CoV_x$, $CoNb_x$, $CoTa_x$, $CoFe_xTa_y$, $CoCr_x$, $CoMo_x$, $CoW_x$, $NiCr_x$, $NiTi_x$, $NiZr_x$, $NiHf_x$, $NiV_x$, $NiNb_x$, $NiTa_x$, $NiMo_x$, $NiW_x$, $CoNi_xTa_y$, $CoNi_xCr_y$, $CoNi_xTi_y$, $FeTi_x$, $FeZr_x$, $FeHf_x$, $FeV_x$, $FeNb_x$, $FeTa_x$, $FeCr_x$, $FeMo_x$, $FeW_x$, or any combination thereof. In cases where the perpendicular enhancement material contains one or more ferromagnetic elements, such as Co, Fe, and Ni, the total content of the ferromagnetic elements of the perpendicular enhancement material may be less than the threshold required for becoming magnetic, thereby rendering the material essentially non-magnetic. Alternatively, the perpendicular enhancement material that contains one or more ferromagnetic elements may be very thin, thereby rendering the material paramagnetic or magnetically dead. One or more of the PELs 258, 268, 278, and 288 may alternatively have a multilayer structure comprising two or more layers of perpendicular enhancement sublayers, each of which is made of a suitable perpendicular enhancement material described above. For example and without limitation, one or more of the PELs 258, 268, 278, and 288 may have a bilayer structure, such as but not limited to W/Ta, Ta/W, Mo/Ta, Ta/Mo, W/Hf, Hf/W, Mo/Hf, or Hf/Mo.

FIG. 23A is a cross sectional view of a memory cell formed by integrating the MTJ memory element having the exemplary structure 190 shown in FIG. 17A and the selector element having the exemplary structure 122 shown in FIG. 10. The second electrode structure 126 of the selector element 122 is formed adjacent to the magnetic fixed layer structure 212. In some embodiments, the memory cell of FIG. 23A includes an optional interface layer structure 230 formed between the magnetic fixed layer structure 212 and the second electrode structure 126. The optional interface layer structure 230 may include one or more interface layers with each layer being made of a suitable material, such as but not limited to Ta, $TaN_x$, Ru, Ir, Rh, Ti, $TiN_x$, Zr, $ZrN_x$, Hf, HfN$_x$, V, VN$_x$, Nb, NbN$_x$, Cr, Mo, W, NiCr$_x$, FeNi$_x$Cr$_y$, NiTi$_x$, NiTa$_x$, NiZr$_x$, NiHf$_x$, NiV$_x$, NiNb$_x$, NiMo$_y$, NiW$_x$, TiSi$_x$, NiSi$_x$, CoSi$_x$, CoCr$_x$, CoTi$_x$, CoTa$_x$, CoZr$_x$, CoHf$_x$, CoV$_x$, CoNb$_x$, CoMo$_x$, CoW$_x$, MgO$_x$, or any combination thereof. The one or more interface layers each may alternatively have a multilayer structure with one or more layers of a first material interleaved with one or more layers of a second material. The first material may be Co or Ni and the second material may be Cr, Mo, W, Ta, Nb, V, Ti, Zr, Hf, Ir, or Rh. For example and without limitation, the optional interface layer structure 230 may include a tantalum layer formed adjacent to the second electrode structure 126 and a [Ni/Ti] multilayer structure formed adjacent to the magnetic fixed layer structure 212. Alternatively, the optional interface layer structure 230 may include a tantalum layer formed adjacent to the second electrode structure 126 and a NiCr$_x$ layer formed adjacent to the magnetic fixed layer structure 212. Still alternatively, the optional interface layer structure 230 may include a layer of tantalum nitride (TaN$_x$) or titanium nitride (TiN$_x$).

The exemplary MTJ memory element structure 190 of the memory cell shown in FIG. 23A may be replaced by the exemplary structure 190' illustrated in FIG. 17B, thereby disposing the magnetic free layer structure 200 adjacent to the second electrode structure 126.

The MTJ memory element having the exemplary structure 190 shown in FIG. 17A and the selector element having the exemplary structure 122 shown in FIG. 10 may be alternatively integrated by disposing the first electrode structure 124 of the selector element 122 adjacent to the magnetic free layer structure 220 as shown in FIG. 23B. In some embodiments, the memory cell of FIG. 23B includes an optional interface layer structure 232 between the magnetic free layer structure 200 and the first electrode structure 124. The optional interface layer structure 232 may include one or more interface layers with each layer being made of a suitable material, such as but not limited to Ta, TaN$_x$, Ru, Ir, Rh, Ti, TiN$_x$, Zr, ZrN$_x$, Hf, HfN$_x$, V, VN, Nb, NbN$_x$, Cr, Mo, W, NiCr$_x$, FeNi$_x$Cr$_y$, NiTi$_x$, NiTa$_x$, NiZr$_x$, NiHf$_x$, NiV$_x$, NiNb$_x$, NiMo$_y$, NiW$_x$, TiSi$_x$, NiSi$_x$, CoSi$_x$, CoCr$_x$, CoTi$_x$, CoTa$_x$, CoZr$_x$, CoHf$_x$, CoV$_x$, CoNb$_x$, CoMo$_x$, CoW$_x$, MgO$_x$, or any combination thereof. The one or more interface layers each may alternatively have a multilayer structure with layers of a first material interleaved with layers of a second material. The first material may be Co or Ni and the second material may be Cr, Mo, W, Ta, Nb, V, Ti, Zr, Hf, Ir, or Rh. For example, the optional interface layer structure 232 may include an MgO$_x$ layer formed adjacent to the magnetic free layer structure 200 and a ruthenium (Ru) layer formed adjacent to the first electrode structure 124. Alternatively, the optional interface layer structure 232 may include a tantalum layer formed adjacent to the first electrode structure 124 and a ruthenium layer formed adjacent to the magnetic free layer structure 200. Still alternatively, the optional interface layer structure 232 may include multiple layers with one MgO$_x$ layer formed adjacent to the magnetic free layer structure 200. Yet alternatively, the optional interface layer structure 232 may include a layer of tantalum nitride (TaN$_x$) or titanium nitride (TiN$_x$).

The exemplary MTJ memory element structure 190 of the memory cell shown in FIG. 23B may be replaced by the exemplary structure 190' illustrated in FIG. 17B, thereby disposing the magnetic fixed layer structure 212 adjacent to the first electrode structure 124.

FIG. 23C is a cross sectional view of a memory cell formed by integrating the MTJ memory element having the exemplary structure 220 shown in FIG. 17C and the selector element having the exemplary structure 122 shown in FIG. 10. The second electrode structure 126 of the selector element 122 is formed adjacent to the magnetic reference layer structure 202. In some embodiments, the memory cell of FIG. 23C includes the optional interface layer structure 230 between the magnetic reference layer structure 202 and the second electrode structure 126. The exemplary MTJ memory element structure 220 of the memory cell shown in FIG. 23C may be replaced by the exemplary structure 220' illustrated in FIG. 17D, thereby disposing the magnetic compensation layer structure 222 adjacent to the second electrode structure 126.

The MTJ memory element having the exemplary structure 220 shown in FIG. 17C and the selector element having the exemplary structure 122 shown in FIG. 10 may be alternatively integrated by disposing the first electrode structure 124 of the selector element 122 adjacent to the magnetic compensation layer structure 222 as shown in FIG. 23D. In some embodiments, the memory cell of FIG. 23D includes the optional interface layer structure 232 between the magnetic compensation layer structure 222 and the first electrode structure 124. The exemplary MTJ memory element structure 220 of the memory cell shown in FIG. 23D may be replaced by the exemplary structure 220' illustrated in FIG. 17D, thereby disposing the magnetic reference layer structure 202 adjacent to the first electrode structure 124.

The magnetic memory cells shown in FIGS. 23A and 23C may be fabricated by deposition the layers 124-128 corresponding to the selector element 122 on substrates or wafers and followed by deposition of the magnetic memory element structures 190 and 220 on the selector element 122. Likewise, the magnetic memory cells shown in FIGS. 23B and 23D may be fabricated by deposition of the layers corresponding to the magnetic memory element structures 190 and 220 on substrates or wafers and followed by deposition of the films corresponding to the selector element 122 on the magnetic memory element structures 190 and 220.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:
1. A memory cell comprising:
a magnetic tunnel junction (MTJ) memory element including a magnetic free layer structure and a magnetic reference layer structure with an insulating tunnel junction layer interposed therebetween, said magnetic free layer structure including one or more magnetic free layers having a variable magnetization direction substantially perpendicular to layer planes thereof, said magnetic reference layer structure including one or more magnetic reference layers having a first invariable magnetization direction substantially perpendicular to layer planes thereof; and
a two-terminal selector element coupled to said MTJ memory element in series, said two-terminal selector element including:
a first electrode and a second electrode with a volatile switching layer interposed therebetween, said volatile switching layer including a plurality of metal-rich particles or clusters embedded in an insulating matrix;

a third electrode formed adjacent to said first electrode opposite said volatile switching layer; and a fourth electrode formed adjacent to said second electrode opposite said volatile switching layer.

2. The memory cell of claim 1, wherein said insulating matrix is made of an oxide.

3. The memory cell of claim 1, wherein said insulating matrix comprises hafnium and oxygen.

4. The memory cell of claim 1, wherein said first and second electrodes are inert electrodes.

5. The memory cell of claim 1, wherein said first and second electrodes are made of titanium nitride.

6. The memory cell of claim 1, wherein said first and second electrodes are made of a same conductive material selected from the group consisting of tantalum nitride, titanium silicide, nickel silicide, cobalt silicide, and any combinations thereof.

7. The memory cell of claim 1, wherein said third and fourth electrodes are active electrodes.

8. The memory cell of claim 1, wherein said first and second electrodes are inert electrodes, and said third and fourth electrodes are active electrodes.

9. The memory cell of claim 1, wherein said plurality of metal-rich particles or clusters and said third and fourth electrodes are made of a same material.

10. The memory cell of claim 1, wherein said plurality of metal-rich particles or clusters and said third and fourth electrodes are made of silver.

11. The memory cell of claim 1, wherein said plurality of metal-rich particles or clusters and said third and fourth electrodes are made of a same material selected from the group consisting of copper, cobalt, nickel, and any combinations thereof.

12. The memory cell of claim 1, wherein said two-terminal selector element further includes a fifth electrode formed adjacent to said third electrode opposite said first electrode and a sixth electrode formed adjacent to said fourth electrode opposite said second electrode.

13. The memory cell of claim 12, wherein said fifth and sixth electrodes are inert electrodes.

14. The memory cell of claim 12, wherein said fifth electrode is made of iridium, ruthenium, or platinum, said sixth electrode is made of iridium, ruthenium, or platinum.

15. The memory cell of claim 1, wherein said MTJ memory element further includes a magnetic fixed layer structure exchanged coupled to said magnetic reference layer structure through an anti-ferromagnetic coupling layer, said magnetic fixed layer structure having a second invariable magnetization direction that is substantially perpendicular to a layer plane thereof and is opposite to said first invariable magnetization direction.

* * * * *